(12) United States Patent
Kiss et al.

(10) Patent No.: US 8,970,406 B2
(45) Date of Patent: Mar. 3, 2015

(54) INTERLEAVED MULTIPATH DIGITAL POWER AMPLIFICATION

(71) Applicant: LSI Corporation, San Jose, CA (US)

(72) Inventors: Peter Kiss, Basking Ridge, NJ (US);
Said E. Abdelli, Minneapolis, MN (US);
Donald R. Laturell, Oak Hill, FL (US);
Ross S. Wilson, Menlo Park, CA (US);
James F. MacDonald, Stillwater, MN (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 14/184,334

(22) Filed: Feb. 19, 2014

(65) Prior Publication Data

US 2014/0266820 A1 Sep. 18, 2014

Related U.S. Application Data

(60) Provisional application No. 61/791,328, filed on Mar. 15, 2013.

(51) Int. Cl.
*H03M 9/00* (2006.01)
*H04L 25/02* (2006.01)
(Continued)

(52) U.S. Cl.
CPC .............. *H03M 9/00* (2013.01); *H04L 25/02* (2013.01); *H03M 3/30* (2013.01); *H03F 3/217* (2013.01);
(Continued)

(58) Field of Classification Search
CPC ... H03F 3/217; H03F 2200/331; H04L 27/02; H03H 17/0273; H03H 17/028; H03M 3/30; H03M 9/00

USPC .................................. 341/100–101; 375/295
See application file for complete search history.

(56) References Cited

U.S. PATENT DOCUMENTS 6,072,361 A 6/2000 Myers et al.
6,998,914 B2 2/2006 Robinson
(Continued)

FOREIGN PATENT DOCUMENTS

EP 1393438 B1 6/2009
EP 2506426 A1 10/2012

OTHER PUBLICATIONS

Ebrahimi, M. M., et al., "Time-Interleaved Delta-Signma Modulator for Wideband Digitial GHz Transmitters Design and SDR Applications," Progress in Electromagnetics Research B, Jan. 1, 2011, pp. 263-281.
(Continued)

*Primary Examiner* — Khai M Nguyen

(57) ABSTRACT

In one embodiment, a power amplification system of a radio-frequency transmitter includes a digital signal source that provides a digital input signal to an interleaved-bit-stream generator, which outputs a digital switching signal to a switching power amplifier. The interleaved-bit-stream generator has an eight-path interleaving architecture that helps reduce the effective clock-rate requirements of the interleaved-bit-stream generator. The interleaved-bit-stream generator includes an array of fractional-delay filters for receiving the digital input signal and outputting eight fractionally delayed digital output signals to a bit-stream generation array adapted to output eight corresponding bit streams to a serializer block that interleaves and combines the eight bit-streams into the digital switching signal. The relative phases of the interleaved signals may be adjusted to achieve certain desired effects.

20 Claims, 32 Drawing Sheets

(51) Int. Cl.
  *H03M 3/00* (2006.01)
  *H03F 3/217* (2006.01)
  *H03H 17/00* (2006.01)
  *H03H 17/02* (2006.01)
  *H04L 27/02* (2006.01)

(52) U.S. Cl.
  CPC ....... *H03H 17/0018* (2013.01); *H03H 17/0273* (2013.01); *H03H 17/028* (2013.01); *H04L 27/02* (2013.01); *H03F 2200/331* (2013.01)
  USPC ............................. 341/101; 301/100; 375/295

(56) References Cited

U.S. PATENT DOCUMENTS

| | | | |
|---|---|---|---|
| 7,053,700 B2* | 5/2006 | Smiley et al. | 330/10 |
| 7,206,356 B2 | 4/2007 | Le Bars et al. | |
| 7,340,024 B1 | 3/2008 | Nelson et al. | |
| 7,715,493 B2* | 5/2010 | Ravi et al. | 375/296 |
| 8,073,656 B2 | 12/2011 | Pupalaikis et al. | |
| 8,269,555 B2 | 9/2012 | van der Heijden et al. | |
| 2006/0088125 A1 | 4/2006 | Miyatani et al. | |
| 2010/0104043 A1* | 4/2010 | Farrell et al. | 375/296 |
| 2011/0260790 A1 | 10/2011 | Haddad | |
| 2013/0021104 A1 | 1/2013 | Schmidt | |
| 2014/0159991 A1 | 6/2014 | Kiss et al. | |

OTHER PUBLICATIONS

Ebrahimi, M. M., et al., "Delta-Signma-Based Transmitters: Advantages and Disadvantages," IEEE Microwave Magazine, IEEE Service Center, Piscataway, NJ, US, vol. 14, No. 1, Jan. 1, 2013, pp. 68-78.

Johansson, H., et al., "Reconstruction of Nonuniformly Sampled Bandlimited Signals by Means of DigitalFractional Delay Filters," IEEE Transactions on Signal PRocessing, IEEE Service Center, New York, NY, US, vol. 50, No. 11, Nov. 1, 2002, pp. 2757-2767.

"Using High Pass Sigma-Delta Modulation for Class-S Power Amplifiers", http://eprints.nuim.ie, 2007 [retrieved on Jan. 17, 2013]. Retrieved from the Internet: <URL: http://http://eprints.nuim.ie/1342/3/Using_High_Pass_Sigma-Delta_Modulation_(v5).pdf> (16 pages).

Ralph, Stephen et al., "Using High Pass Sigma-Delta Modulation for Class-S Power Amplifiers," 18th European Conference on Circuit Theory and Design (ECCTD), 2007, pp. 707-710.

Podsiadli, Tomasz et al, "Parallelization of Bandpass Sigma-Delta Modulators for Class-S Digital Power Amplifiers,"Conference on Ph.D. Research in Microelectronics and Electronics (PRIME), 2010, pp. 1-4.

Finnerty, Keith et al., "Digital Quadrature Mixing of Lowpass Sigma-Delta Modulators for Switch-mode Power Amplifiers," 20th European Conference on Circuit Theory and Design (ECCTD), 2011, pp. 1-4.

interleave(x,y), www.mathworks.com, 2007 [retrieved on Feb. 11, 2014]. Retrieved from the Internet: <URL: http://www.mathworks.com/matlabcentral/fileexchange/16919-interleave/content/interleave.m> (2 pages).

Johansson, Hakan et al., "Adjustable Fractional-Delay Filters Utilizing the Farrow Structure and Multirate Techniques," 2006 [Retrieved on May 9, 2013]. Retrieved from the Internet: <URL: ticsp.cs.tut.fi/images/0/00/Cr1006-2006.pdf> (6 pages).

Ralph, Stephen, "Class-S Power Amplifier for Use in Mobile Phone Basestations," 2007 [retrieved on Jan. 24, 2013]. Retrieved from the Internet: <URL: callan.nuim.ie/publications/documents/sralph.pdf> (188 pages).

* cited by examiner

103

102

400

600

402

```
function [] = mojac_pathfinder_interleave8x()                    [2012/09/27-09/29]
%% Post Nine Eleven
%%-----------------------------------------------------------------------------
a1        = 0.6;
a2        = 0.4;
f1        = 3;
f2        = 5;
N1        = 20;
N2        = 2*N1;
N4        = 4*N1;
N8        = 8*N1;
%f2 = f1;  a1 = 0.5;  a2 = a1;
ph1_1     = 0;
ph2_1     = pi*f1/N1;
ph3_1     = 0;
ph4_1     = pi*f1/N1;
ph5_1     = 0;
ph6_1     = pi*f1/N1;
ph7_1     = 0;
ph8_1     = pi*f1/N1;
ph12_1    = 0;
ph34_1    = pi*f1/N2 + pi;
ph56_1    = 0;
ph78_1    = pi*f1/N2 + pi;
ph1234_1  = 0;
ph5678_1  = pi*f1/N4 + pi/2;  % +pi/2: high-side sampling, -pi/2: low-side sampling
ph12345678_1 = 0;
```

```
ph1_2       = 0;
ph2_2       = pi*2/N1;
ph3_2       = 0;
ph4_2       = pi*2/N1;
ph5_2       = 0;
ph6_2       = pi*2/N1;
ph7_2       = 0;
ph8_2       = pi*2/N1;
ph12_2      = 0;
ph34_2      = pi*2/N2 + pi;
ph56_2      = 0;
ph78_2      = pi*2/N2 + pi;
ph1234_2    = 0;
ph5678_2    = pi*2/N4 - pi/2;  % +pi/2: high-side sampling, -pi/2: low-side sampling
ph12345678_2 = 0;

x1           = a1*sin(2*pi*f1 * (1:N1))/N1 + a2*sin(2*pi*f2 * (1:N1))/N1 + ph1_1 + ph12_1 + ph1234_1) + a2*sin(2*pi*f2 * (1:N1))/N1 + ph1_2 + ph12_2 + ph1234_2); % N1
x2           = a1*sin(2*pi*f1 * (1:N1))/N1 + ph2_1 + ph12_1 + ph1234_1) + a2*sin(2*pi*f2 * (1:N1))/N1 + ph2_2 + ph12_2 + ph1234_2); % N1
x3           = a1*sin(2*pi*f1 * (1:N1))/N1 + ph3_1 + ph34_1 + ph1234_1) + a2*sin(2*pi*f2 * (1:N1))/N1 + ph3_2 + ph34_2 + ph1234_2); % N1
x4           = a1*sin(2*pi*f1 * (1:N1))/N1 + ph4_1 + ph34_1 + ph1234_1) + a2*sin(2*pi*f2 * (1:N1))/N1 + ph4_2 + ph34_2 + ph1234_2); % N1
x5           = a1*sin(2*pi*f1 * (1:N1))/N1 + ph5_1 + ph56_1 + ph5678_1) + a2*sin(2*pi*f2 * (1:N1))/N1 + ph5_2 + ph56_2 + ph5678_2); % N1
x6           = a1*sin(2*pi*f1 * (1:N1))/N1 + ph6_1 + ph56_1 + ph5678_1) + a2*sin(2*pi*f2 * (1:N1))/N1 + ph6_2 + ph56_2 + ph5678_2); % N1
x7           = a1*sin(2*pi*f1 * (1:N1))/N1 + ph7_1 + ph78_1 + ph5678_1) + a2*sin(2*pi*f2 * (1:N1))/N1 + ph7_2 + ph78_2 + ph5678_2); % N1
x8           = a1*sin(2*pi*f1 * (1:N1))/N1 + ph8_1 + ph78_1 + ph5678_1) + a2*sin(2*pi*f2 * (1:N1))/N1 + ph8_2 + ph78_2 + ph5678_2); % N1
x12          = interleave2(x1, x2);                % N2
x34          = interleave2(x3, x4);                % N2
x56          = interleave2(x5, x6);                % N2
x78          = interleave2(x7, x8);                % N2
x1234        = interleave2(x12, x34);              % N4
x5678        = interleave2(x56, x78);              % N4
x12345678    = interleave2(x1234, x5678);          % N8
```

```
X1         = 1/N1 * abs(fft(x1));
X2         = 1/N1 * abs(fft(x2));
X12        = 1/N2 * abs(fft(x12));
X3         = 1/N1 * abs(fft(x3));
X4         = 1/N1 * abs(fft(x4));
X34        = 1/N2 * abs(fft(x34));
X1234      = 1/N4 * abs(fft(x1234));
X5         = 1/N1 * abs(fft(x5));
X6         = 1/N1 * abs(fft(x6));
X56        = 1/N2 * abs(fft(x56));
X7         = 1/N1 * abs(fft(x7));
X8         = 1/N1 * abs(fft(x8));
X78        = 1/N2 * abs(fft(x78));
X5678      = 1/N4 * abs(fft(x5678));
X12345678  = 1/N8 * abs(fft(x12345678));

figure;
nna = 1;         eval(sprintf('xa=X%d;',nna)); eval(sprintf('Xa=X%d;',nna)); Na = N1;
nnb = 2;         eval(sprintf('xb=X%d;',nnb)); eval(sprintf('Xb=X%d;',nnb)); Nb = N1;
nnc = 12;        eval(sprintf('xc=X%d;',nnc)); eval(sprintf('Xc=X%d;',nnc)); Nc = N2;
mojac_pathfinder_interleave8x_plot (xa,Xa, xb,Xb, xc,Xc, nna,nnb,nnc, Na,Nb,Nc, f1);

figure;
nna = 12;        eval(sprintf('xa=X%d;',nna)); eval(sprintf('Xa=X%d;',nna)); Na = N2;
nnb = 34;        eval(sprintf('xb=X%d;',nnb)); eval(sprintf('Xb=X%d;',nnb)); Nb = N2;
nnc = 1234;      eval(sprintf('xc=X%d;',nnc)); eval(sprintf('Xc=X%d;',nnc)); Nc = N4;
mojac_pathfinder_interleave8x_plot (xa,Xa, xb,Xb, xc,Xc, nna,nnb,nnc, Na,Nb,Nc, f1);

figure;
nna = 1234;      eval(sprintf('xa=X%d;',nna)); eval(sprintf('Xa=X%d;',nna)); Na = N4;
nnb = 5678;      eval(sprintf('xb=X%d;',nnb)); eval(sprintf('Xb=X%d;',nnb)); Nb = N4;
nnc = 12345678;  eval(sprintf('xc=X%d;',nnc)); eval(sprintf('Xc=X%d;',nnc)); Nc = N8;
```

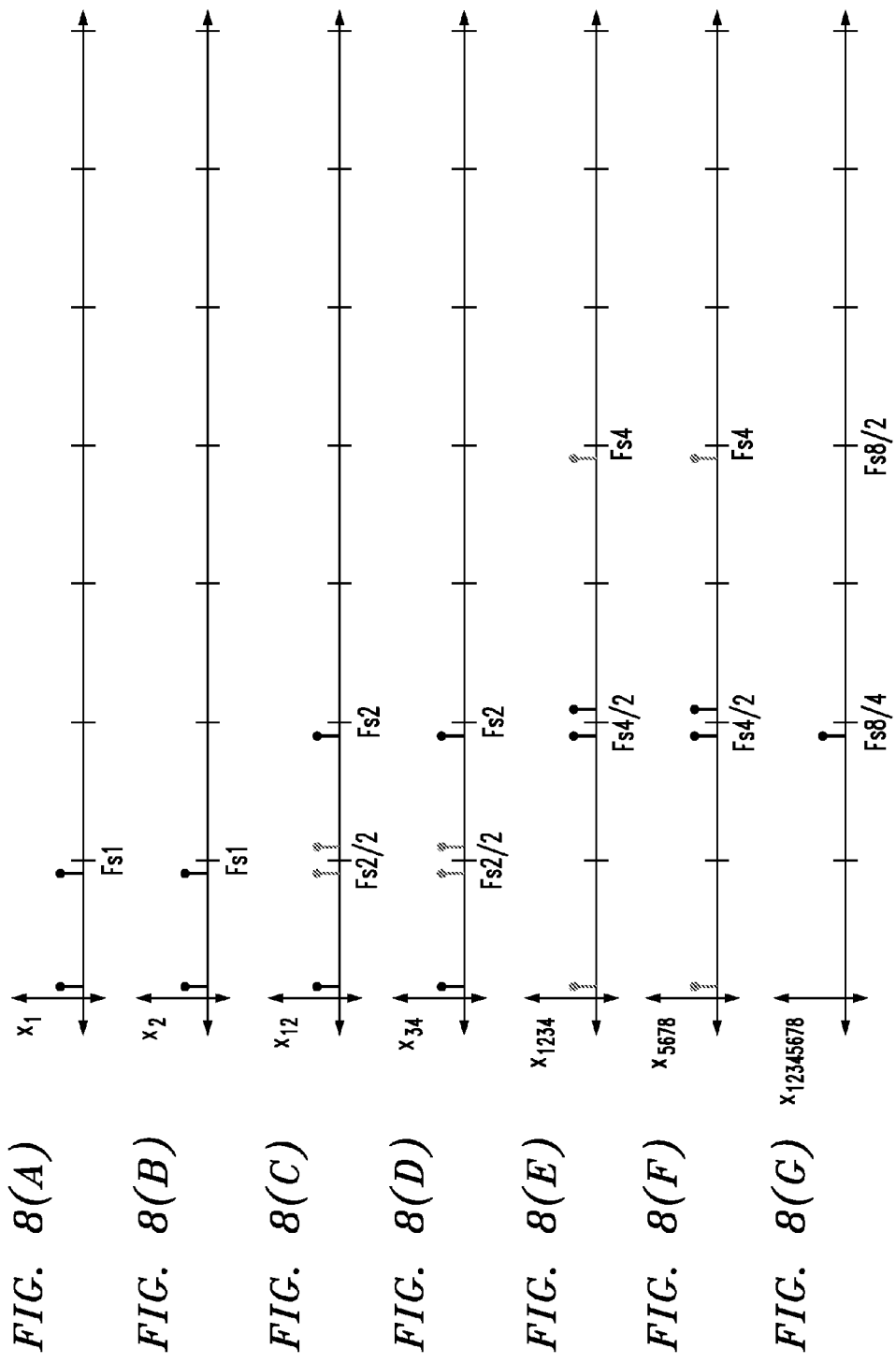

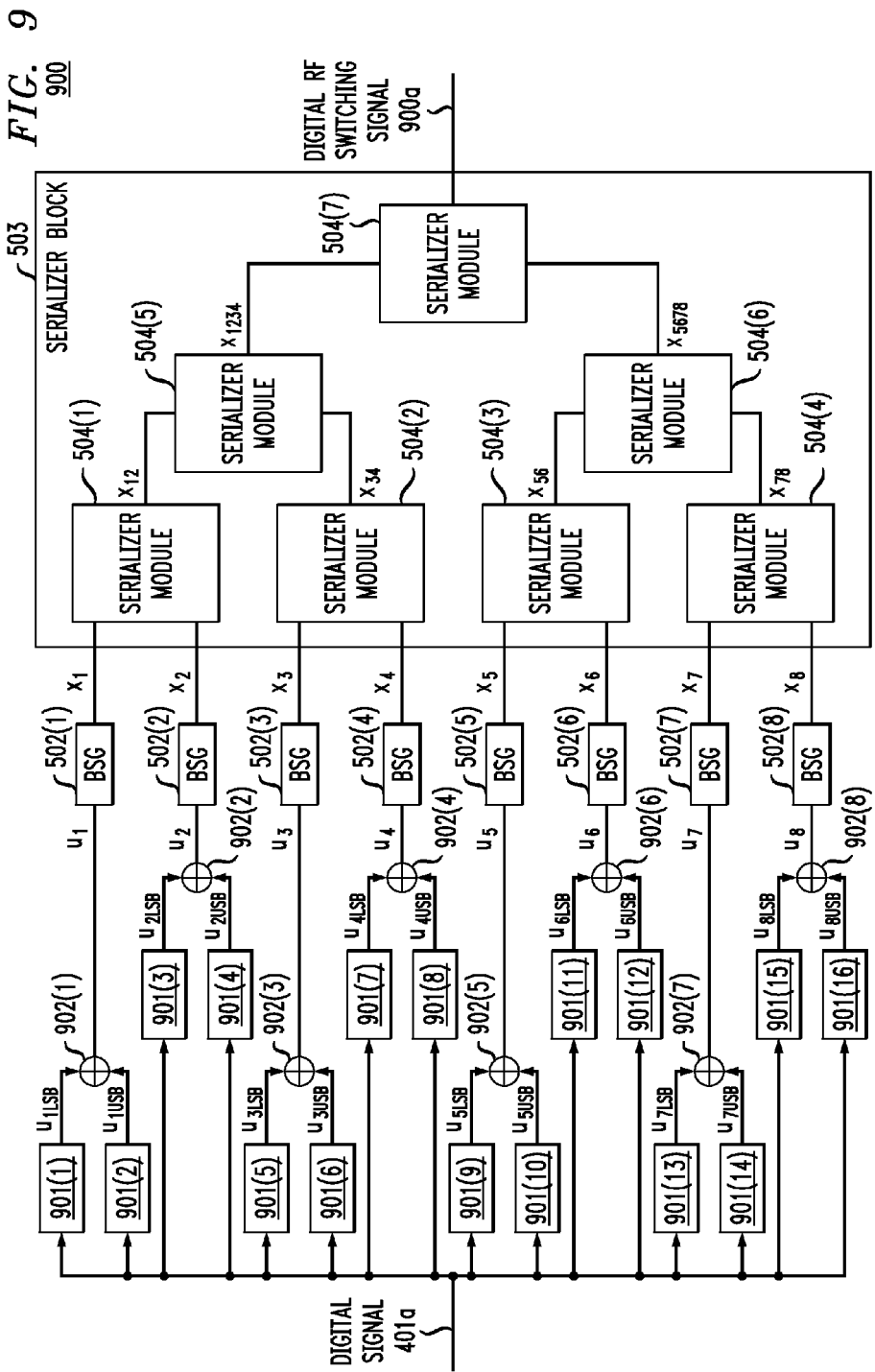

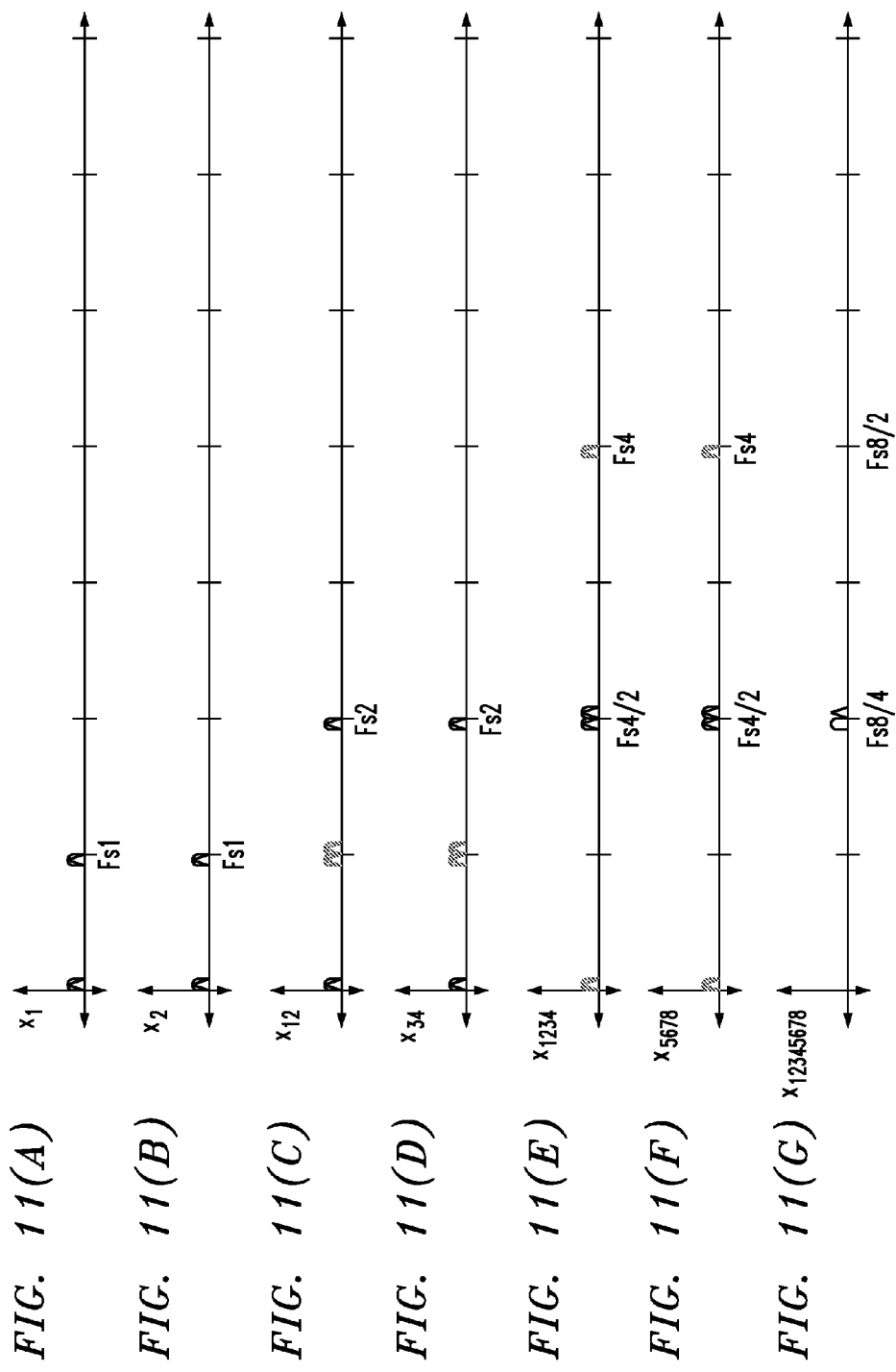

FIG. 13(A)
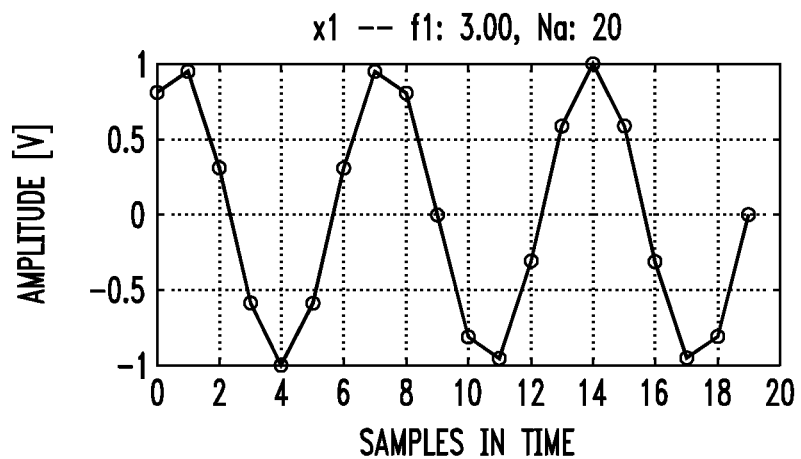
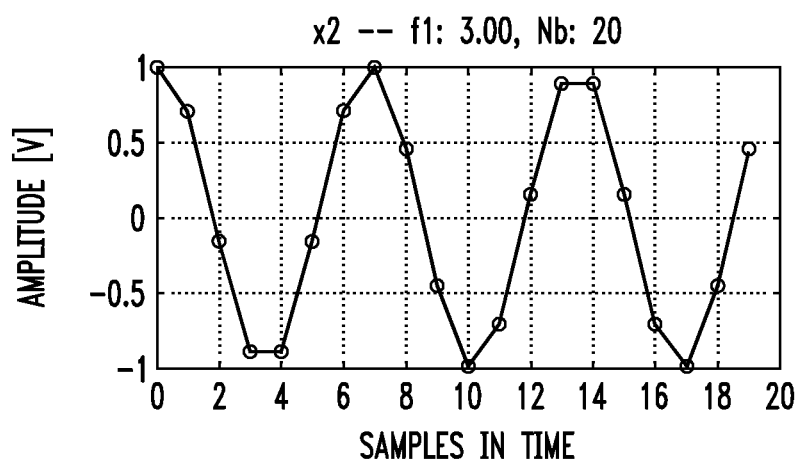
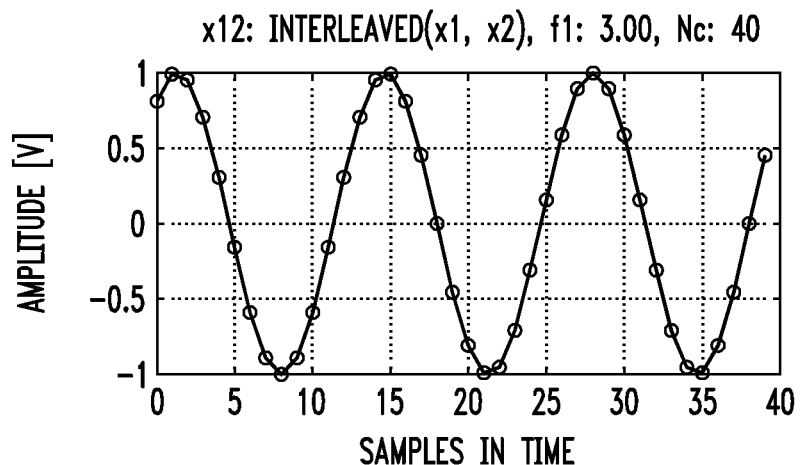

FIG. 13(A)cont.
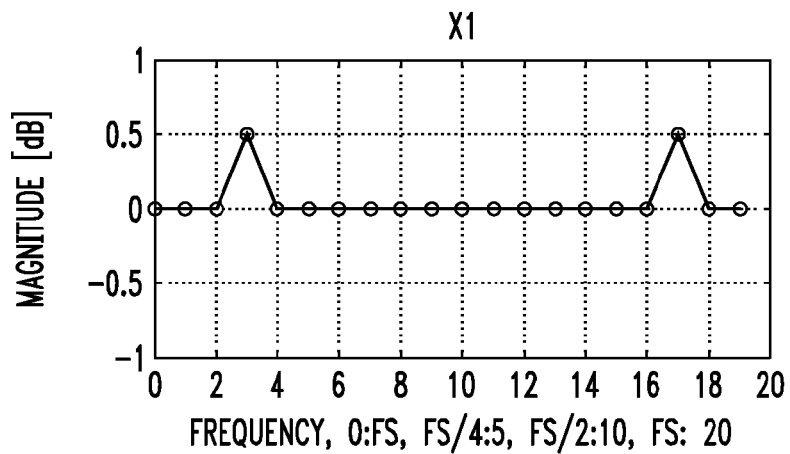
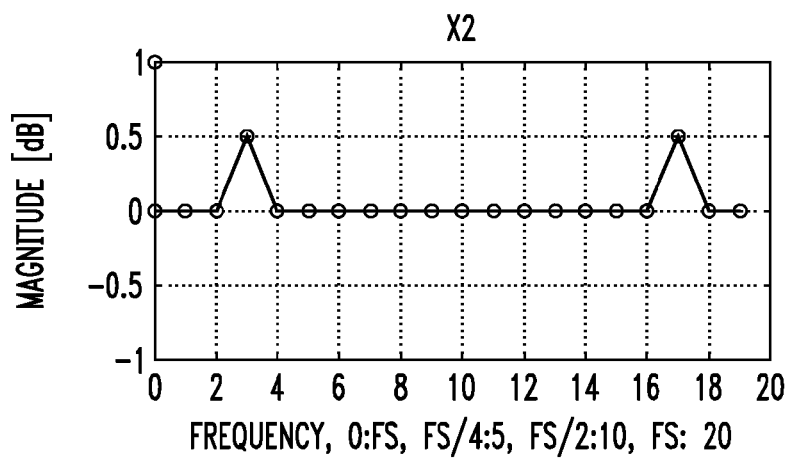
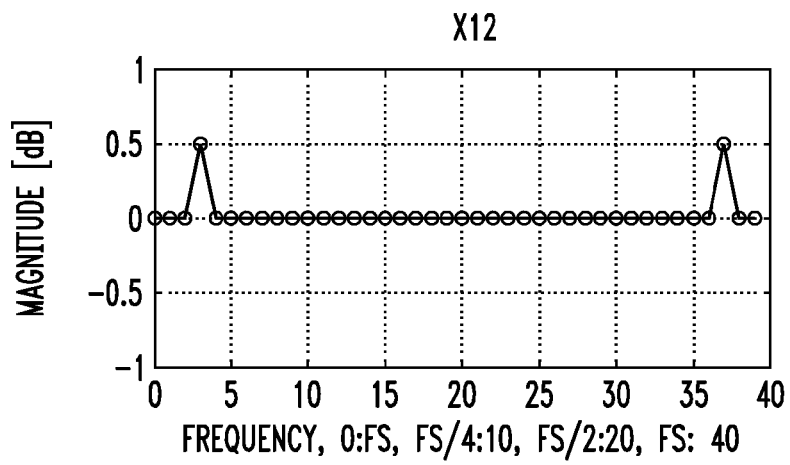

FIG. 13(B)
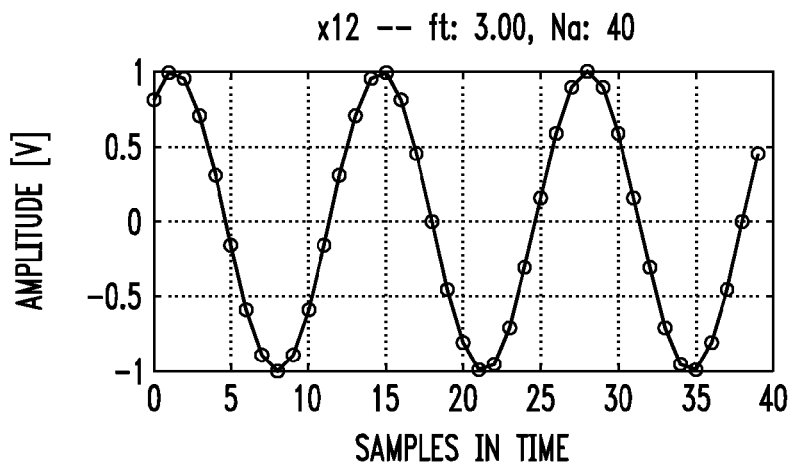
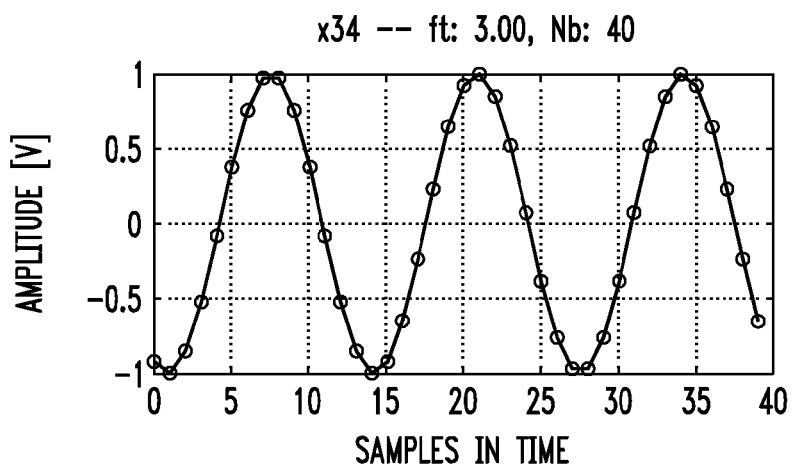
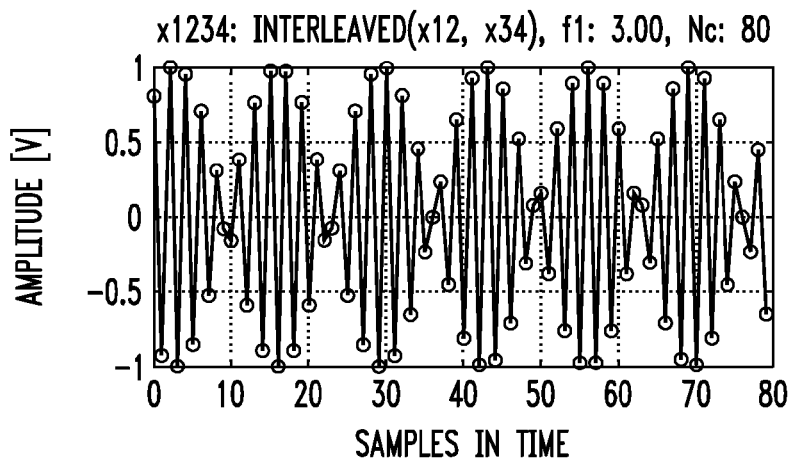

FIG. 13(B)cont.
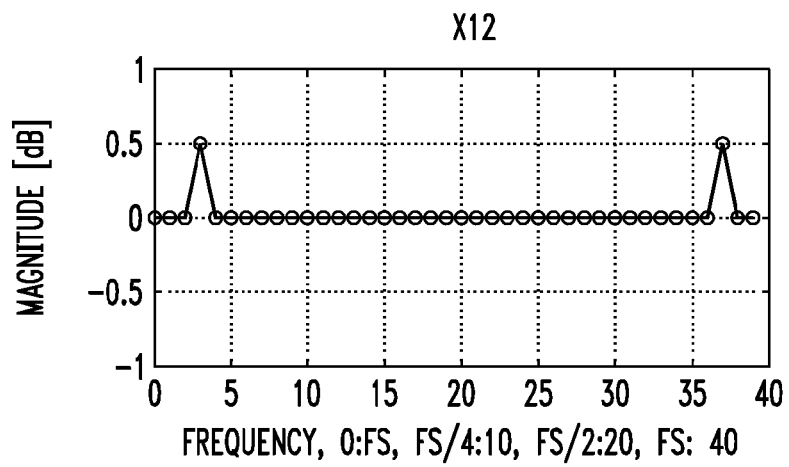
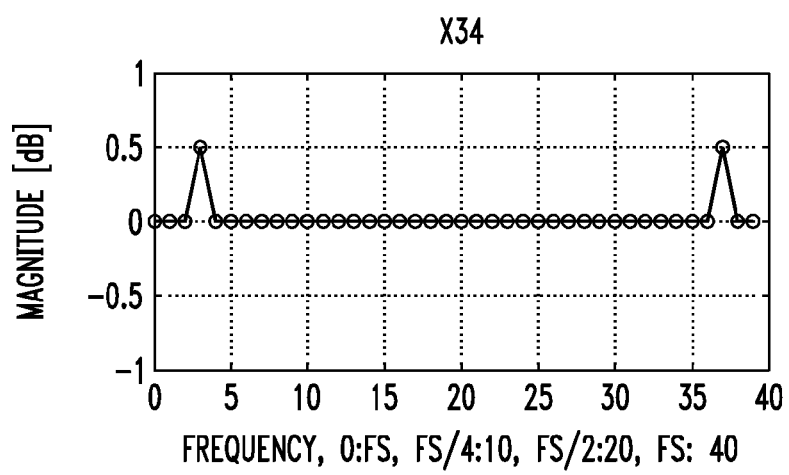
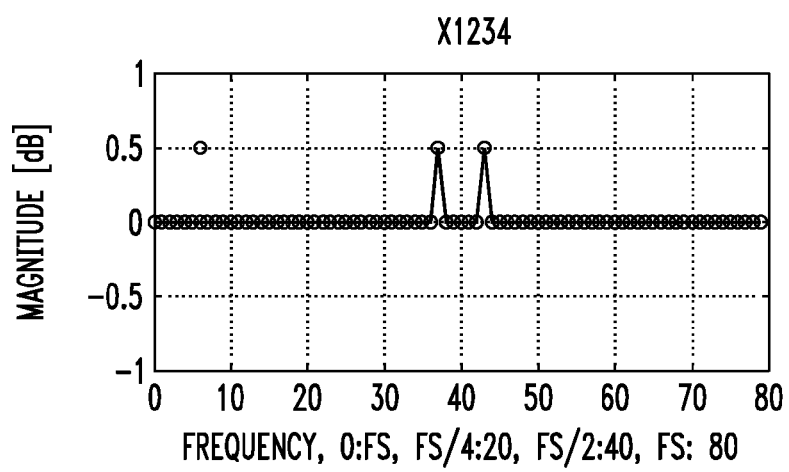

FIG. 13(C)
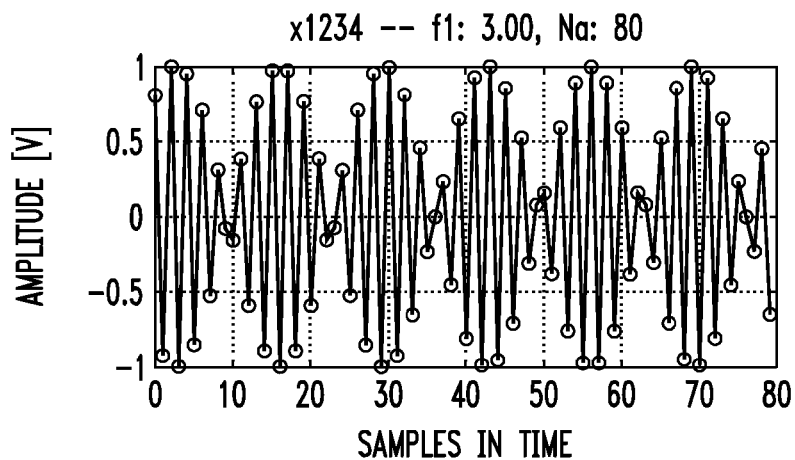
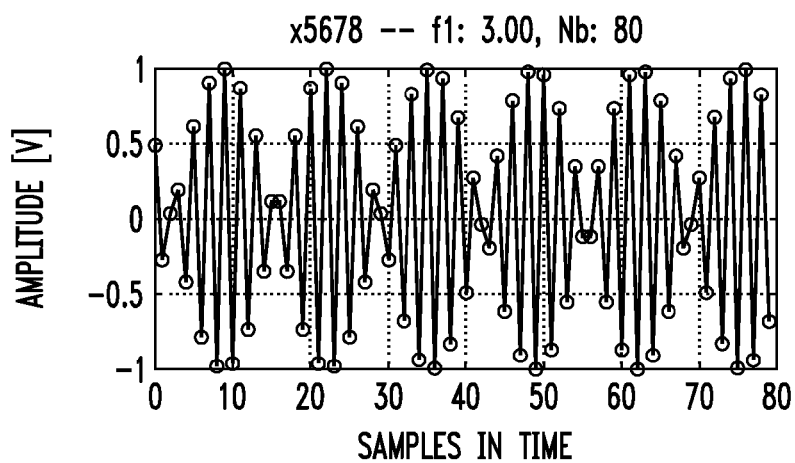
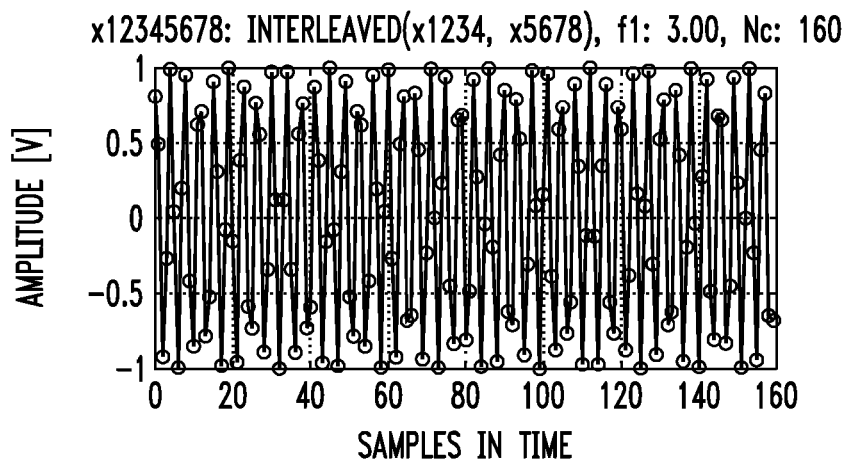

FIG. 13(C)cont.
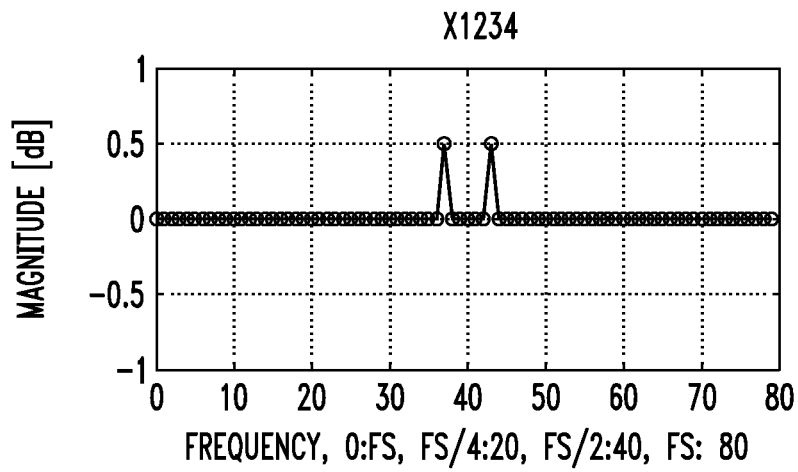
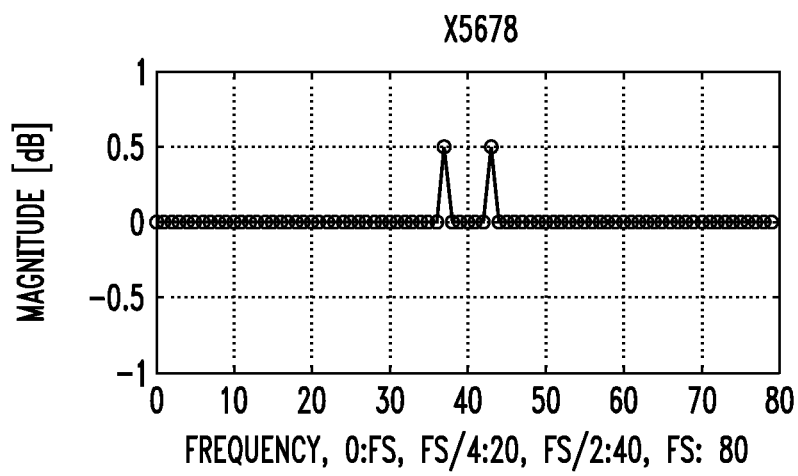
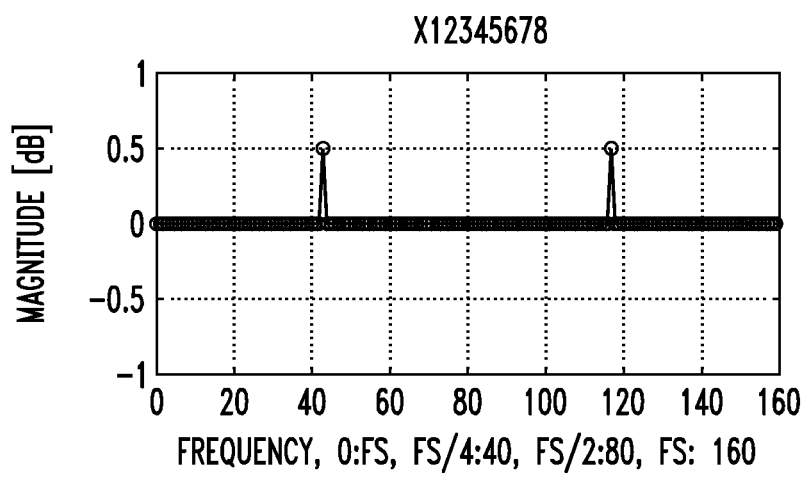

FIG. 14(A)
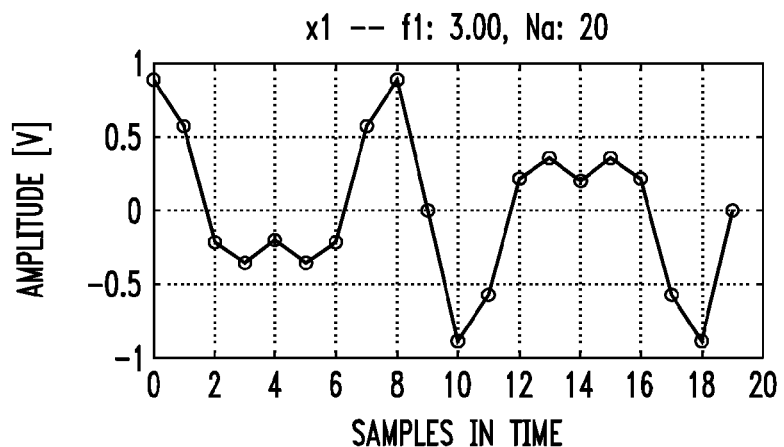
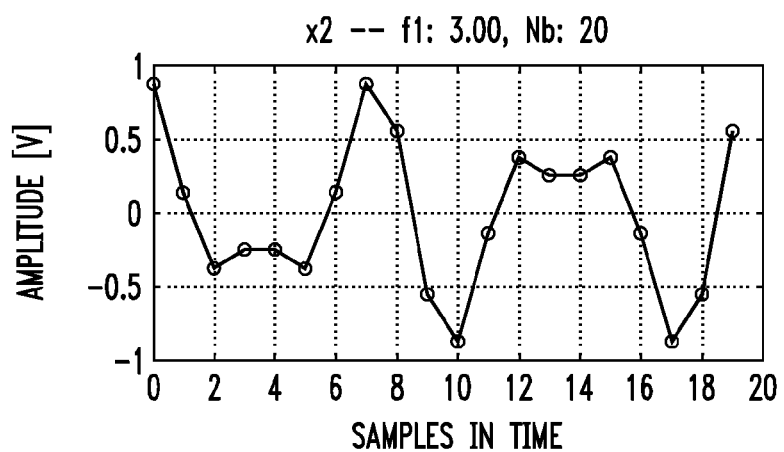
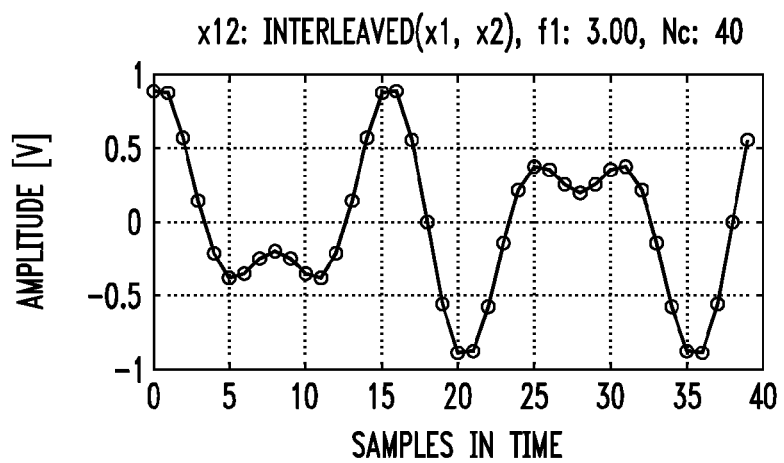

FIG. 14(A)cont.
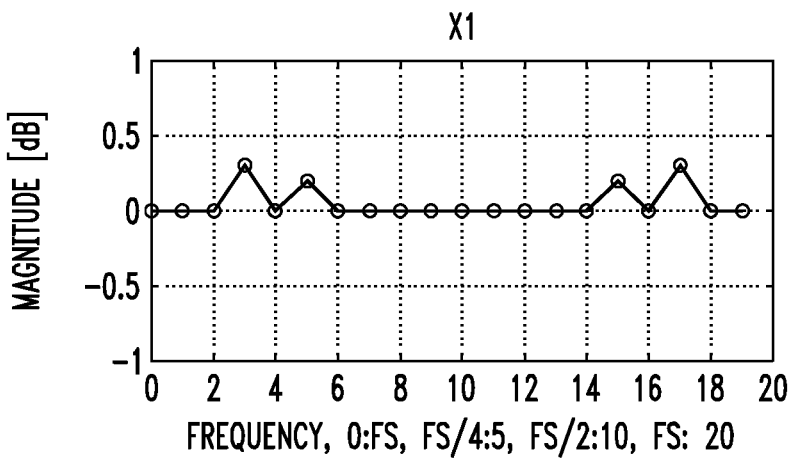
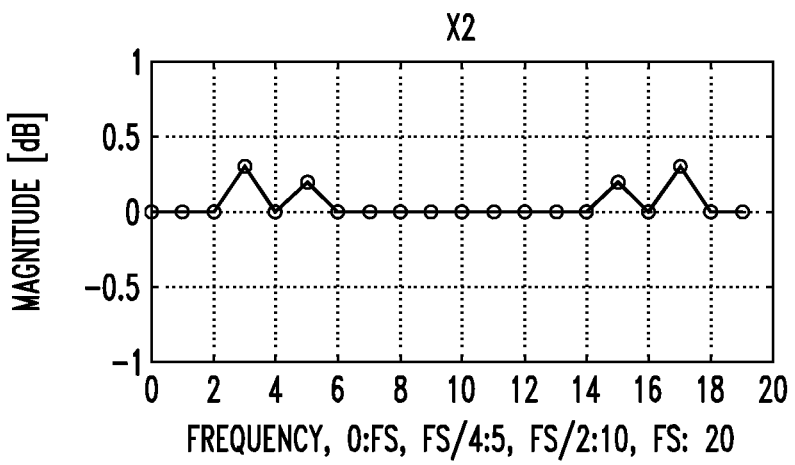
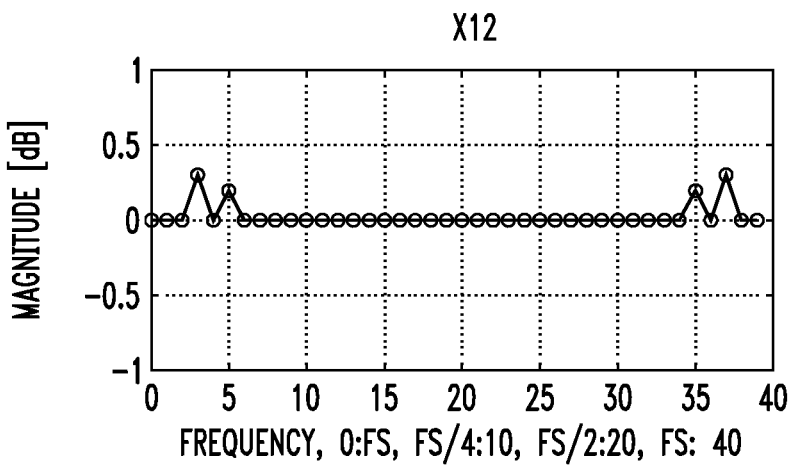

FIG. 14(B)
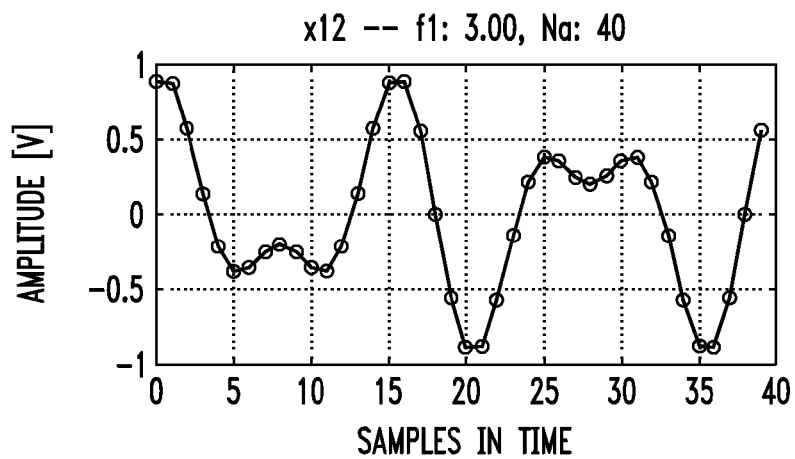
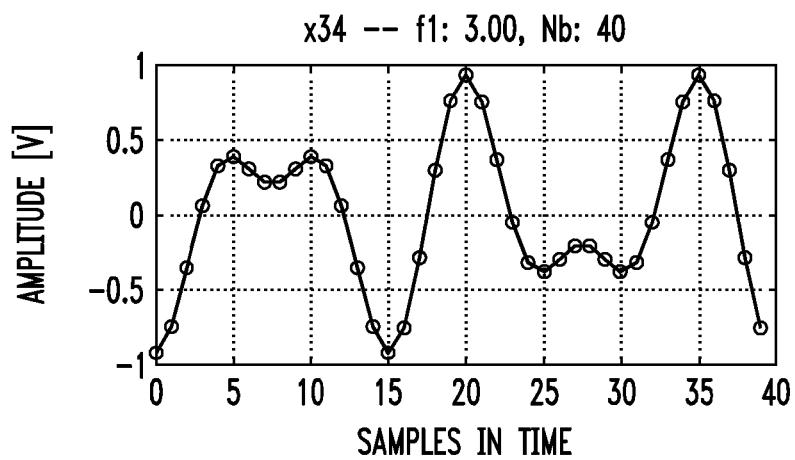
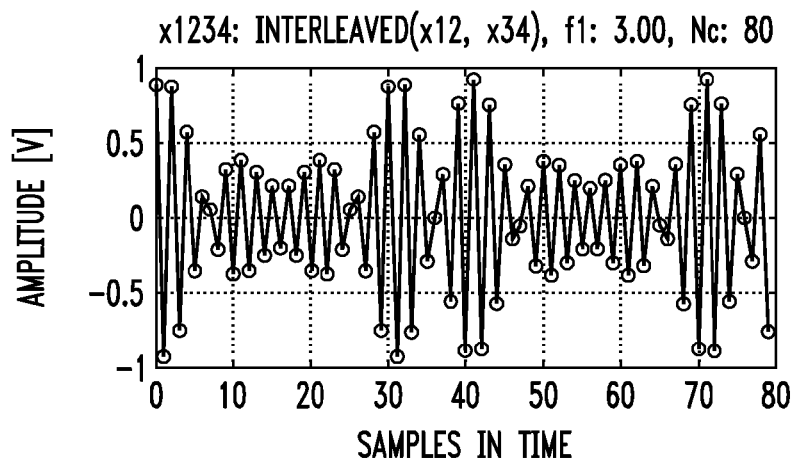

FIG. 14(B)cont.
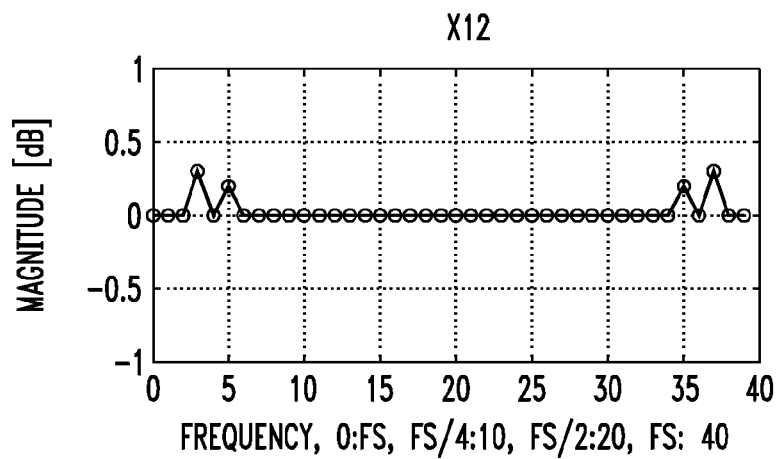
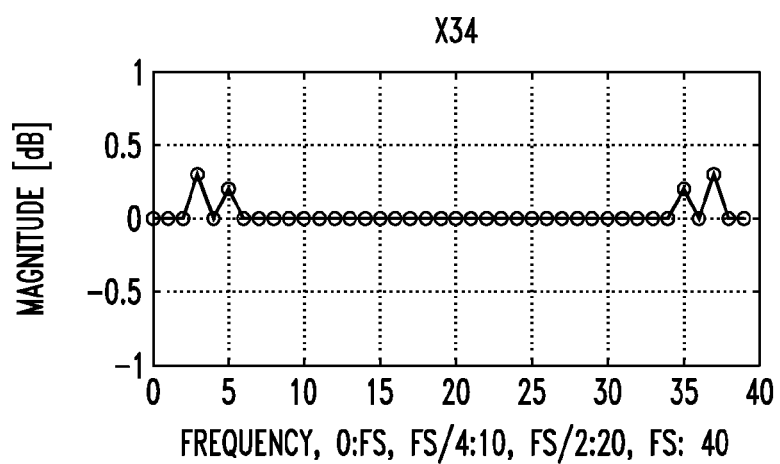
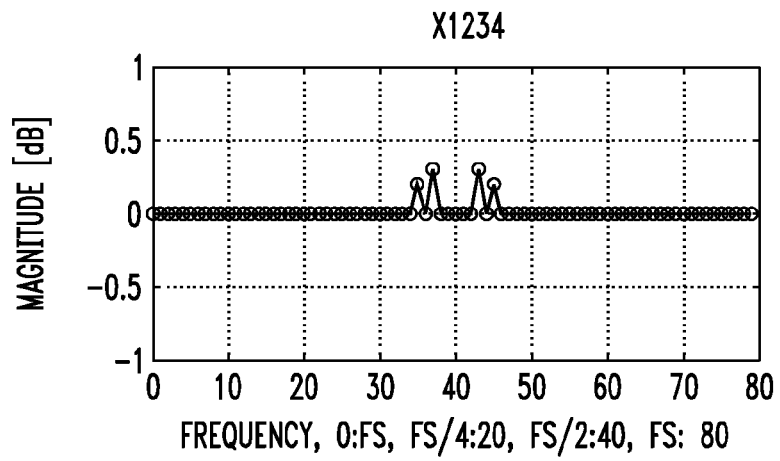

FIG. 15(A)
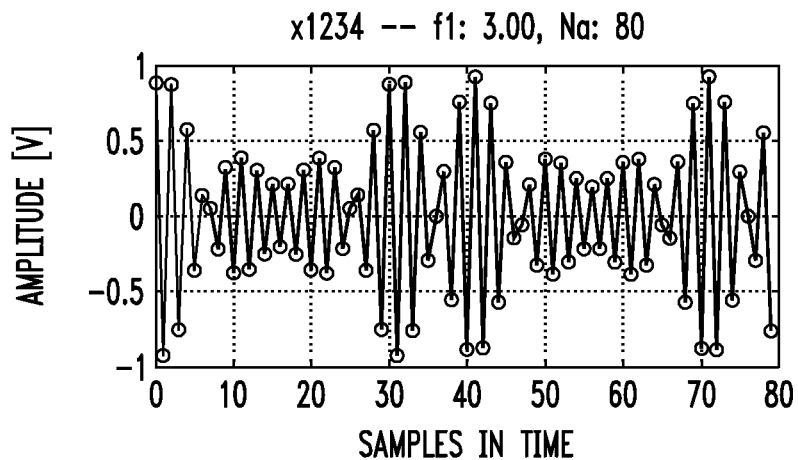
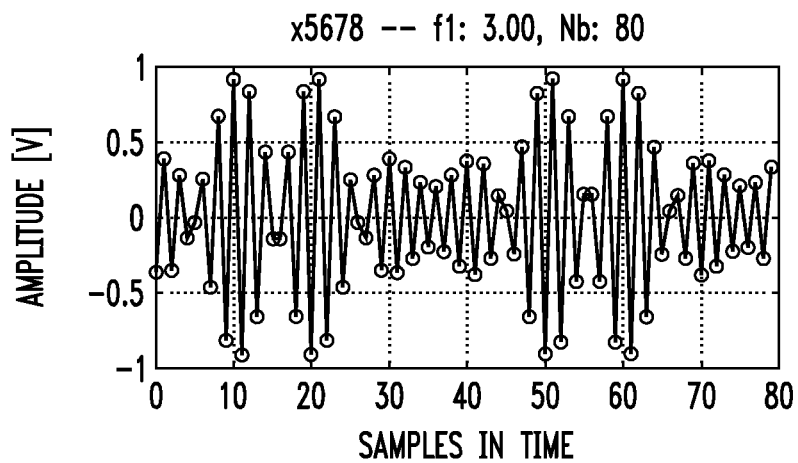
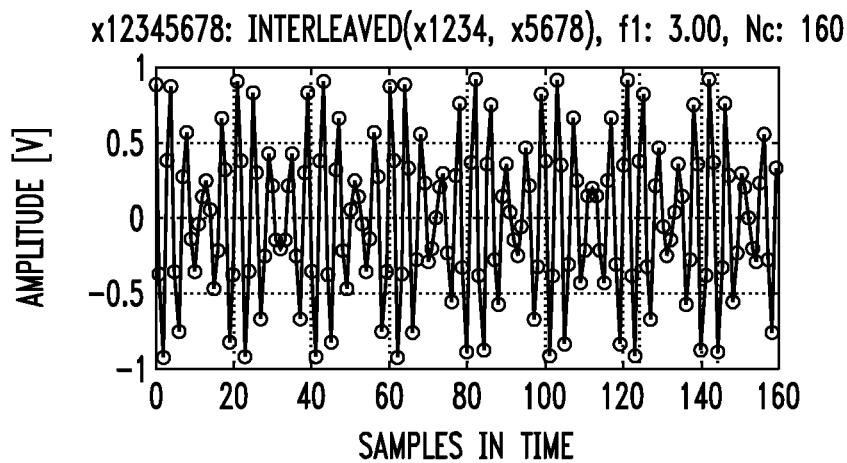

FIG. 15(A)cont.
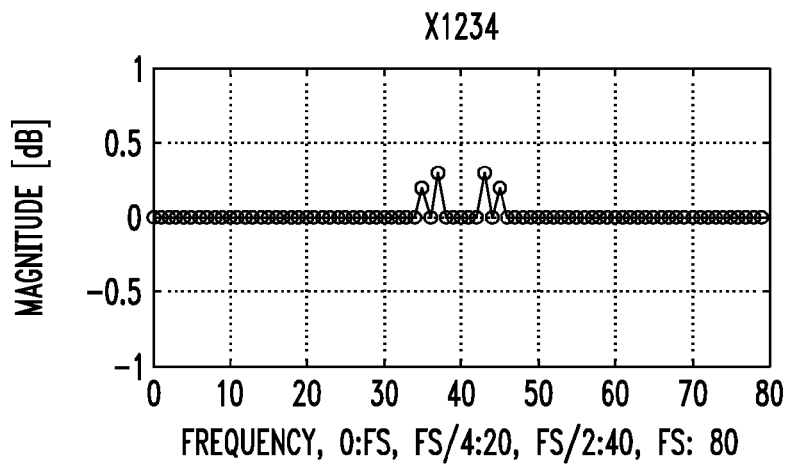
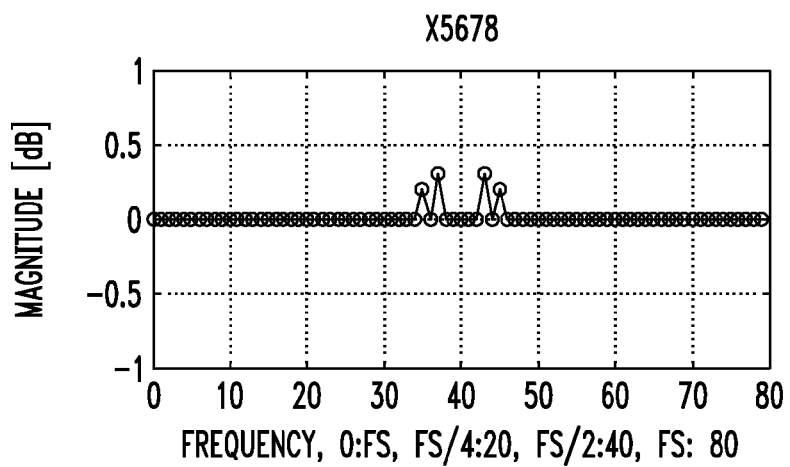
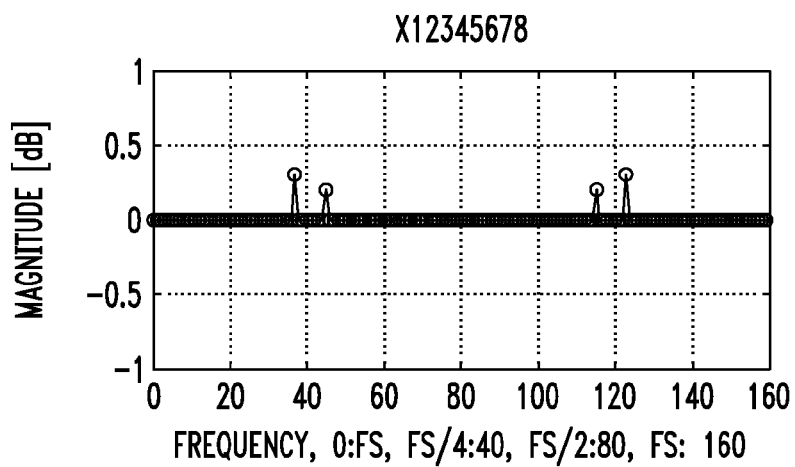

FIG. 15(B)
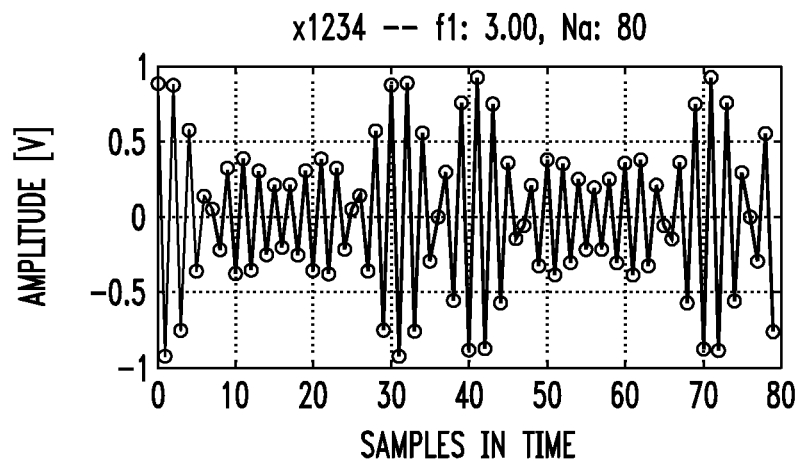
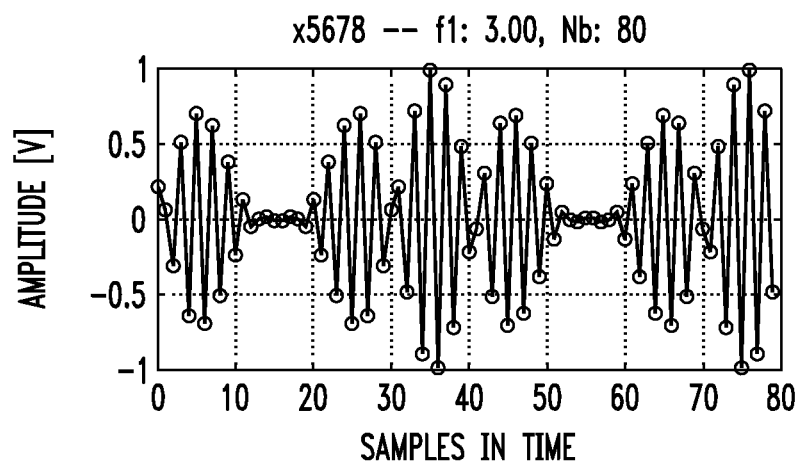
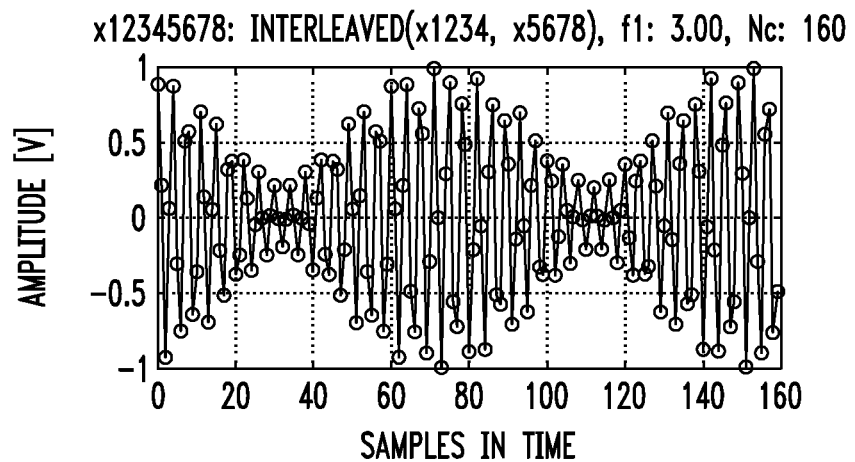

FIG. 15(B)cont.
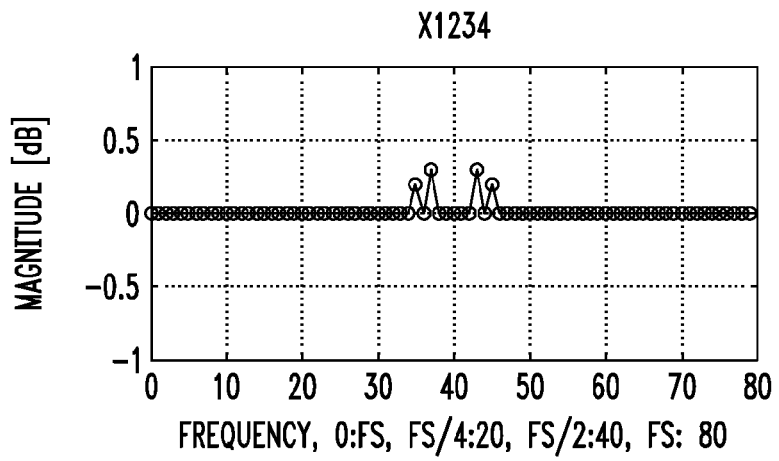
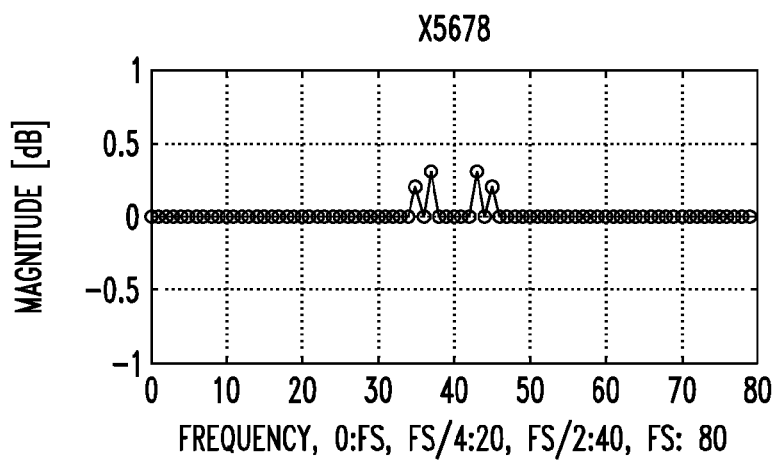
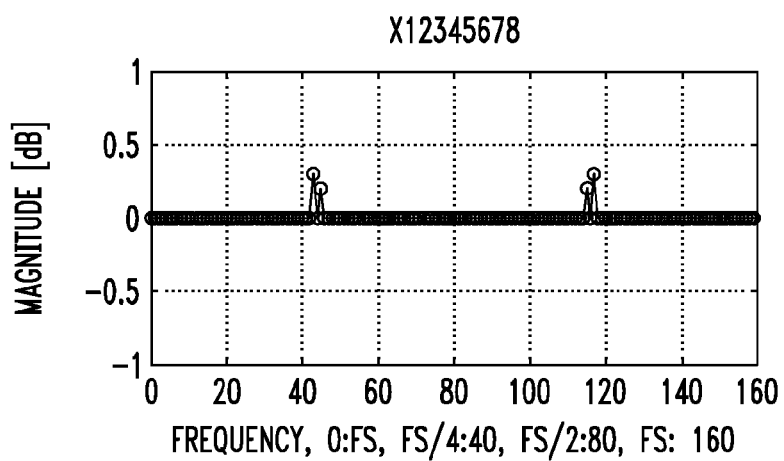

FIG. 15(C)
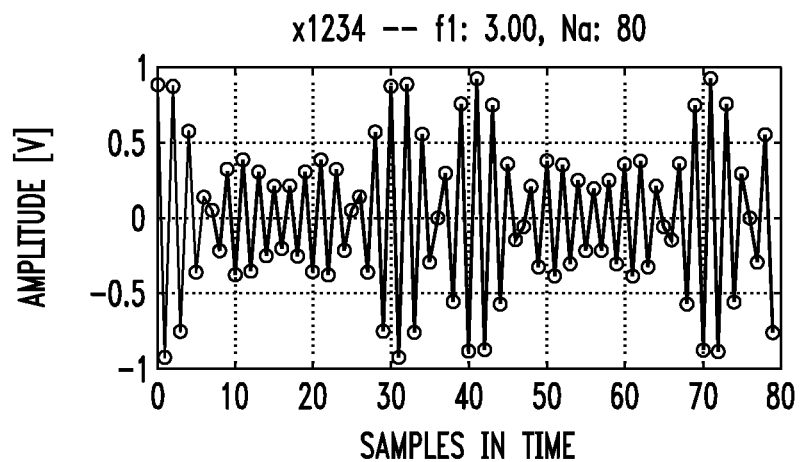
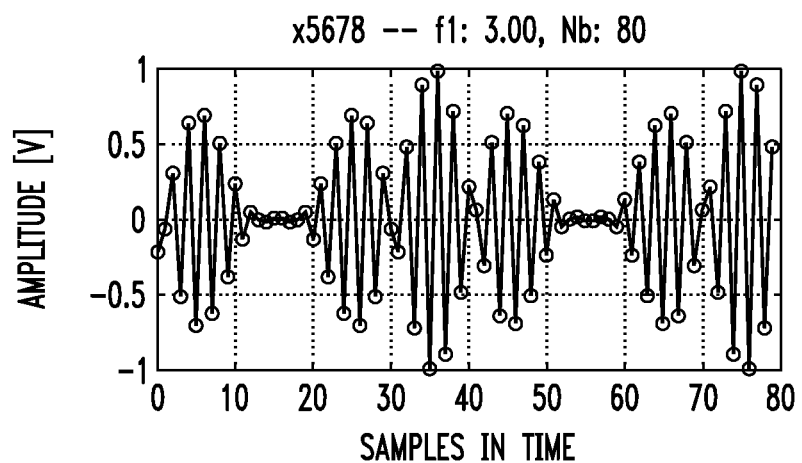
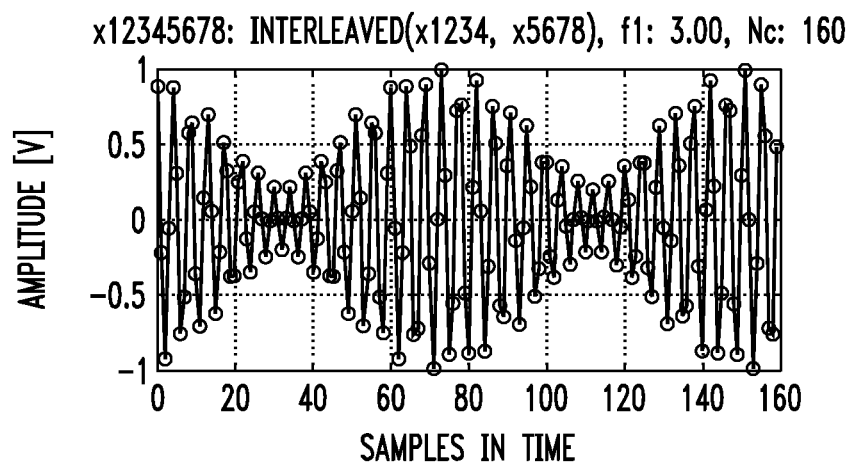

FIG. 15(C)cont.
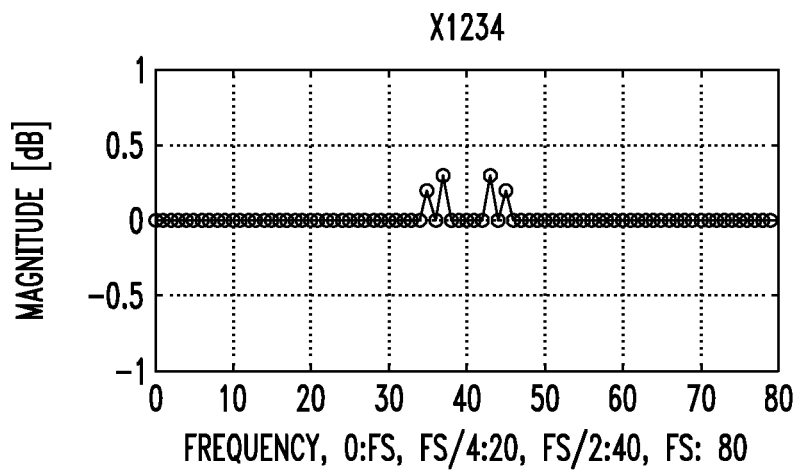
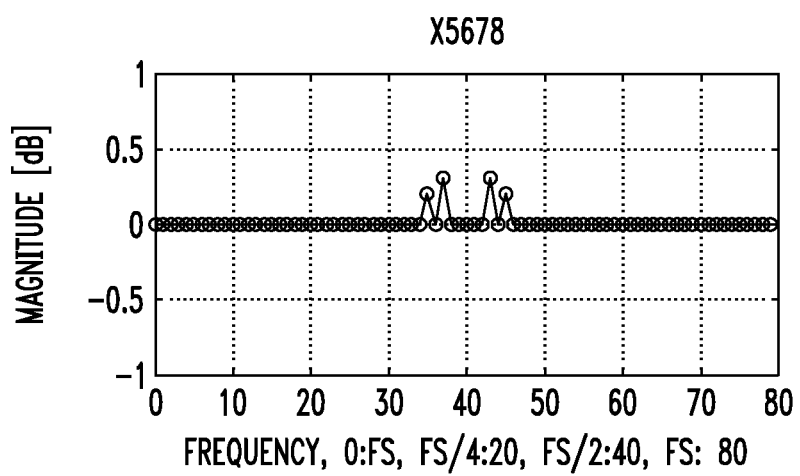
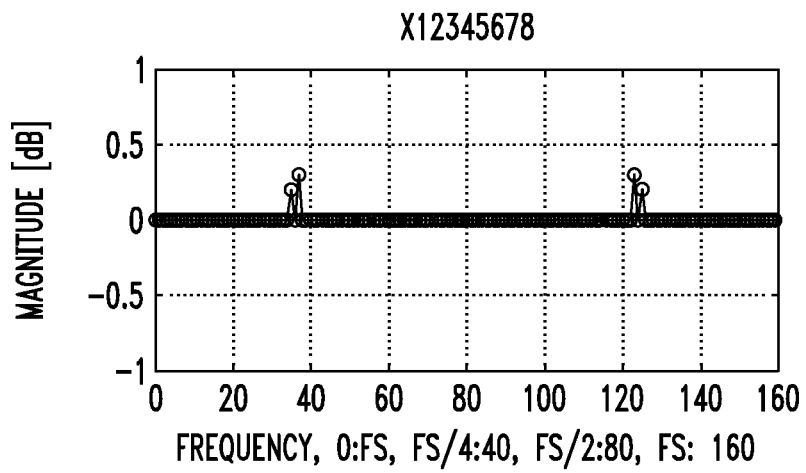

FIG. 15(D)
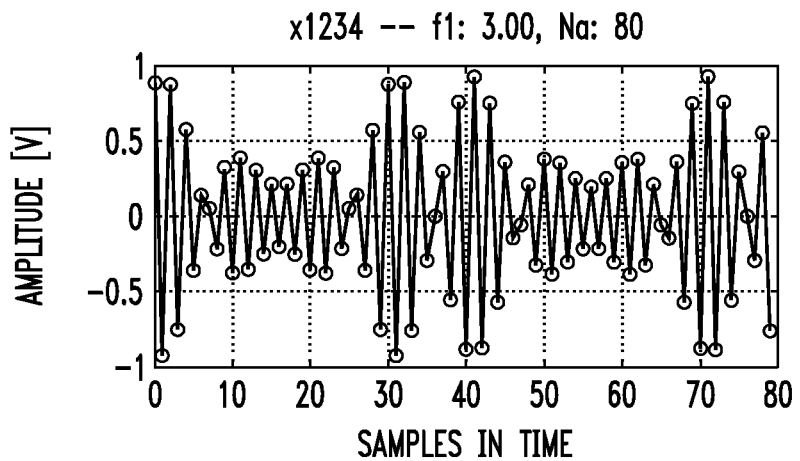
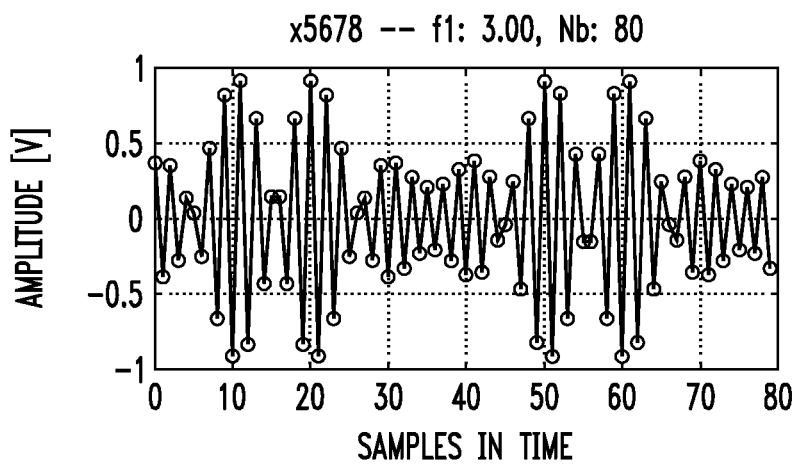
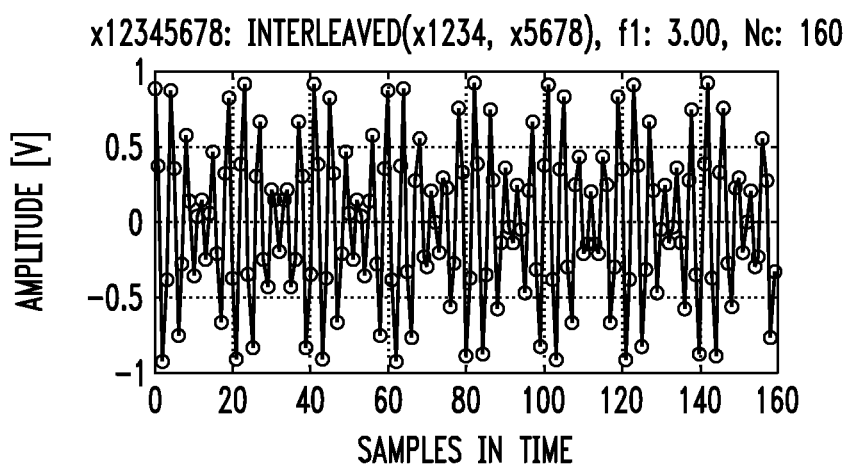

FIG. 15(D)cont.
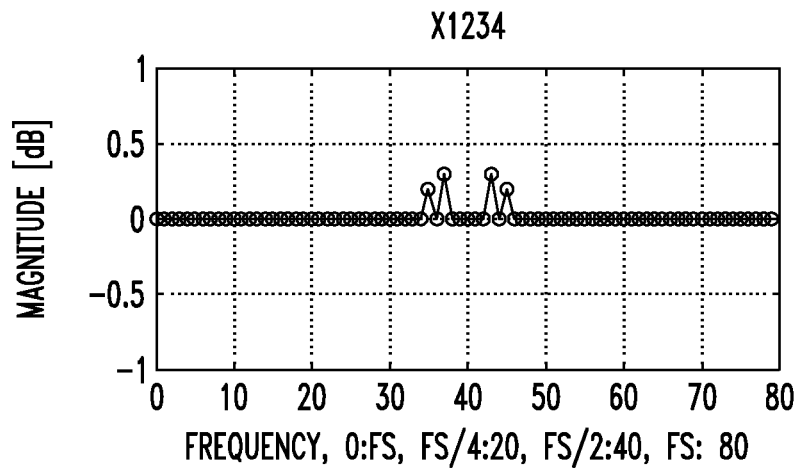
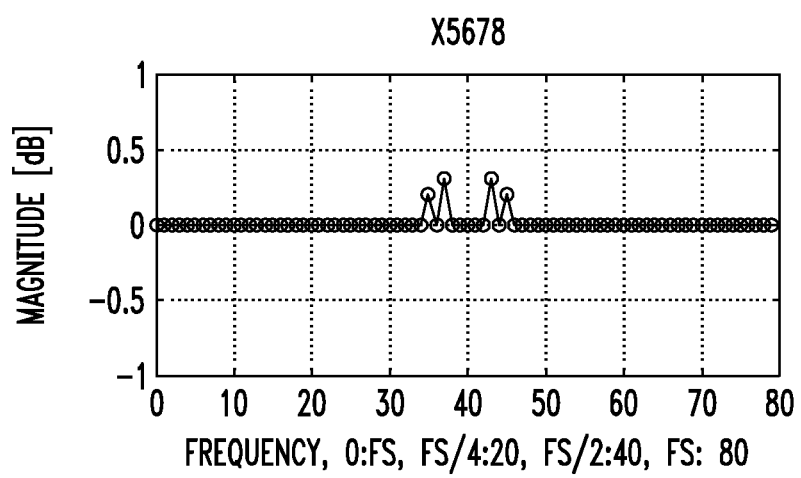
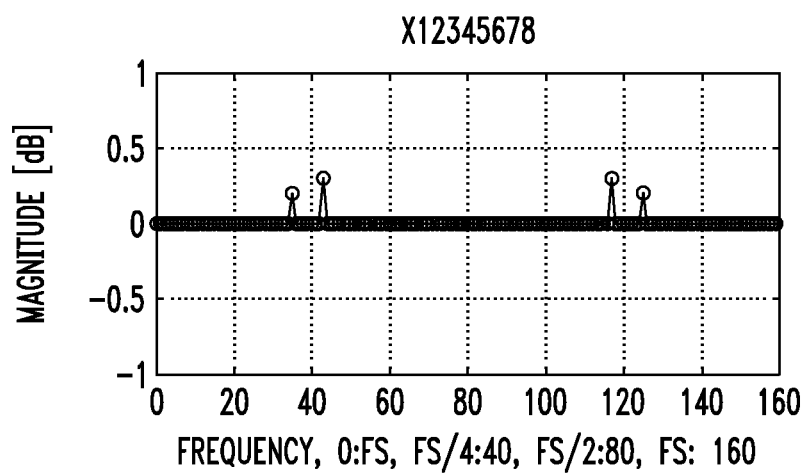

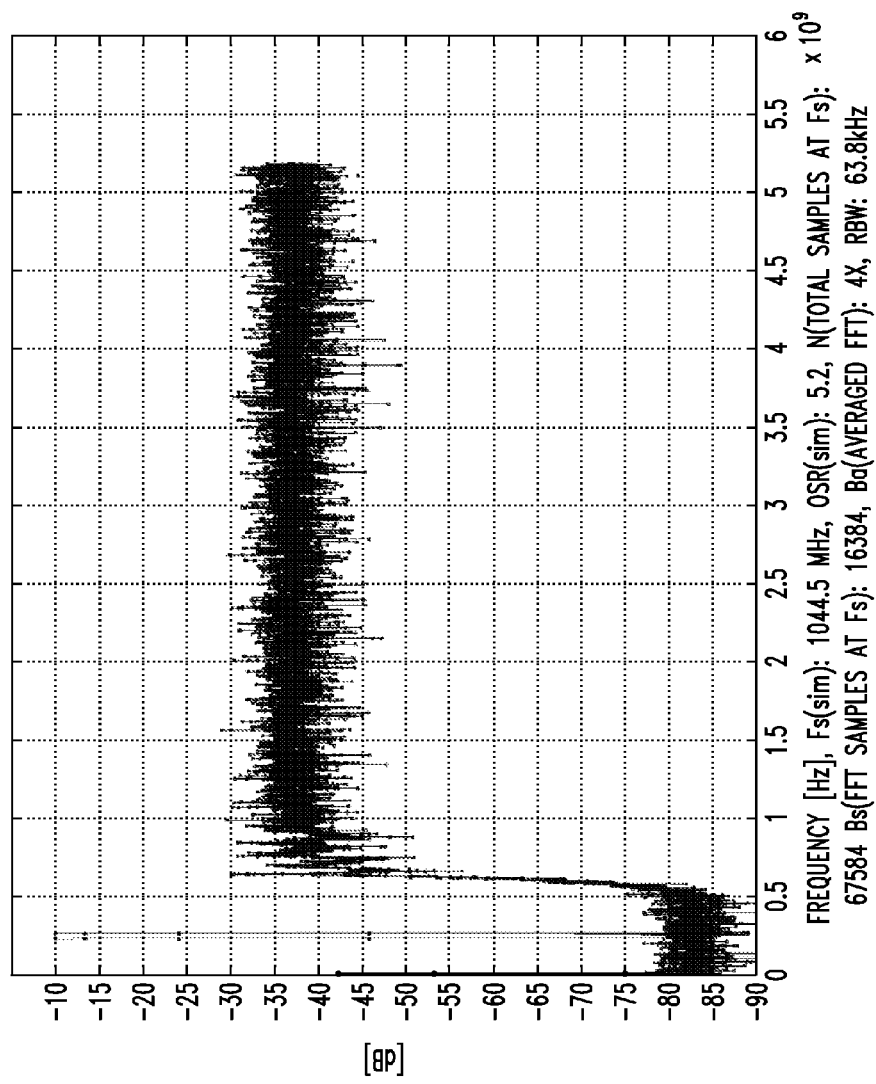

INTERLEAVED MULTIPATH DIGITAL POWER AMPLIFICATION

This application claims the benefit of the filing date of U.S. Provisional Application No. 61/791,328 filed on Mar. 15, 2013, the teachings of which are incorporated herein by reference in their entirety.

BACKGROUND

1. Field

The current disclosure relates to digital power amplifiers, and more specifically, but not exclusively, to digital power amplifiers for radio-frequency transmission systems.

2. Description of the Related Art

Radio-frequency (RF) transmitters communicate with RF receivers using radio-frequency electromagnetic signals. A typical RF transmitter includes a processing module and an antenna. A digital processing module uses relatively low-power digital signals. The signals transmitted by the antenna, however, need to be relatively high-powered and analog in order to be picked up by antennas in the RF receivers. Consequently, a power amplifier is typically used by RF transmitters on outgoing signals between the processing module and the antenna.

Conventional power amplifiers that use analog components provide relatively low power efficiencies. Digital power amplifiers, such as so-called class-D and class-S amplifiers, can be significantly more efficient than analog power amplifiers. Increasing the power-use efficiency may reduce initial costs, operating costs, and maintenance costs of an RF transmitter. The design and operation of various analog and digital power amplifiers are described in Stephen Ralph's "Class-S Power Amplifier For Use In Mobile Phone Basestations," National University of Ireland Maynooth, 2007, incorporated herein by reference in its entirety.

FIG. 1 shows a simplified block diagram of conventional power amplification system 100 of an RF transmitter with a digital processing module. System 100 comprises digital signal source 101 which provides multi-bit, relatively low-frequency, digital baseband (BB) signal 101a to bit-stream generator 102. Bit-stream generator 102 may be, for example, a pulse-width modulator or a sigma-delta modulator. Bit-stream generator 102 generates a digital, low resolution (e.g., 1-bit), radio-frequency switching signal, or bit stream, 102a, which is derived from digital signal 101a based on a transfer function implemented by bit-stream generator 102.

Switching signal 102a is at a higher frequency but a lower resolution than digital signal 101a, because the transformation of signal 101a into signal 102a introduces quantization noise into signal 102a. The transfer function of bit-stream generator 102 may be used for spectral shaping and may be set so that the location, on a frequency scale, of the quantization noise is moved away from a frequency band of interest to an outlying frequency band. Bit-stream generator 102 performs frequency up-conversion from a baseband frequency to a radio frequency and transforms high-resolution digital signal 101a into low-resolution digital signal 102a while maintaining a high signal-to-noise ratio (SNR) in the frequency band of interest.

Switching power amplifier 103 acts as a high-fidelity RF digital-to-analog converter that outputs amplified RF signal 103a based on signal 102a. Signal 103a is then provided to bandpass filter 104, which substantially passes through the frequency band of interest while substantially blocking other frequencies, thereby substantially filtering out the quantization error introduced by bit-stream generator 102. Bandpass filter 104 outputs analog signal 104a, which is provided to antenna 105 for transmission. Note that system 100 uses oversampling, where the sampling frequency of bit-stream signal 102a is several times higher than the desired bandwidth of the analog RF output signal 104a.

FIG. 2 shows a circuit diagram of one conventional implementation of switching power amplifier 103 of FIG. 1, which functions to provide output signal 103a, an amplified analog version of its digital input signal 102a. Amplifier 103 comprises n-channel field-effect transistor (FET) 201 and p-channel FET 202, both of whose gates are controlled by input signal 102a. FETs 201 and 202 may be power transistors using, for example, GaN, LDMOS, or GaAs technologies. The drain terminal of FET 201 is connected to voltage source 203. The drain terminal of FET 202 is connected to common (i.e., ground) voltage 204. The source terminals of FETs 201 and 202 are connected together to generate output signal 103a. Protection diode 205 is connected between the drain and source of FET 201, while protection diode 206 is connected between the drain and source of FET 202. Output signal 103a may go through a broad-band RF band-pass filter (not shown) before being output by amplifier 103. A broad-band RF band-pass filter may be implemented as an RF tank circuit, also known as an LC circuit.

FIG. 3 shows a simplified block diagram of one implementation of bit-stream generator 102 of FIG. 1. Bit-stream generator 102 of FIG. 3 is implemented as a sigma-delta modulator and comprises upsampler 301, loop filter 302, and quantizer 303. A sigma-delta modulator, as its name suggests, performs a summation of differences. Upsampler 301 receives input digital signal 101a at sampling frequency Fs, increases the sampling frequency by a factor P, and outputs digital signal 301a at sampling frequency P*Fs. Signal 301a is one of the inputs to loop filter 302 with the other being signal 102a, the 1-bit output of bit-stream generator 102. Loop filter 302 comprises a comparator and an integrator (not shown) and performs a summing of differences between input 301a and input 102a and outputs the result as signal 302a to quantizer 303. Quantizer 303 outputs a high or low value—corresponding to a positive or negative value, respectively—depending on whether 302a is above or below a set threshold. 1-bit output signal 102a has a sampling frequency of P*Fs.

BRIEF DESCRIPTION OF THE DRAWINGS

Other aspects, features, and advantages of the disclosure will become more fully apparent from the following detailed description, the appended claims, and the accompanying drawings in which like reference numerals identify similar or identical elements.

FIG. 7 shows exemplary source code for simulating the generation of a band-pass bit-stream signal.

FIGS. 8(A)-8(G) are a series of frequency graphs illustrating the exemplary generation by the serializer block of FIG. 5 of a band-pass bit-stream output signal of a single tone.

FIG. 9 shows an alternative implementation of the interleaved-bit-stream generator of FIG. 4.

FIGS. 11(A)-11(G) are a series of related frequency graphs illustrating the processing of signals using substantially the same arrangement as used in FIGS. 8(A)-8(G), but for narrowband (and band-limited) signals.

FIGS. 13(A)-13(C) show time and corresponding spectral plots of simulations using single tones in generating low-pass, high-pass, and band-pass signals.

FIGS. 14(A)-14(B) show time and corresponding spectral plots for exemplary scenarios of FIGS. 11(A)-11(G) using dual tones in generating low-pass and high-pass signals.

FIGS. 15(A)-15(D) show time and corresponding spectral plots for exemplary LSB/USB scenarios using dual tones in generating band-pass signals.

FIGS. 16(A)-16(D) show spectral plots for exemplary scenarios of FIGS. 8(A)-8(G), incorporating bit-stream generators, and using dual-tone bit-streams in generating various signals.

DETAILED DESCRIPTION

Figure 1:
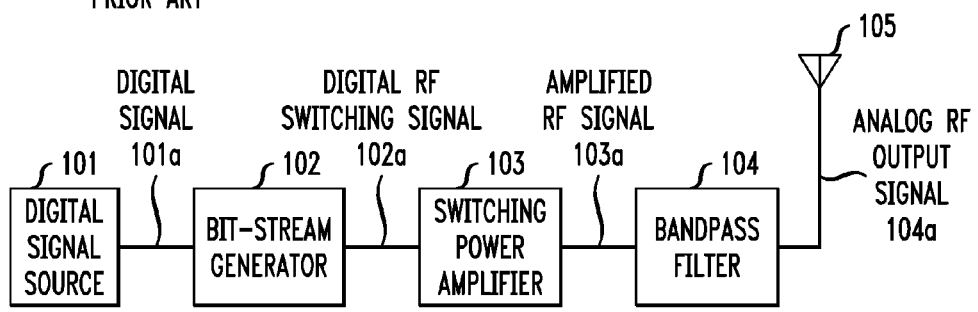
FIG. 1 shows a simplified block diagram of a power amplification segment of a conventional transmitter.
Figure 2:
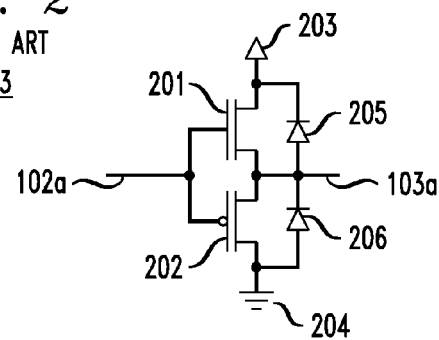
FIG. 2 shows a circuit diagram of one implementation of the switching power amplifier of FIG. 1.

Cellular telecommunication systems include base stations that include subsystems similar to power amplification system 100 of FIG. 1. Cellular telecommunication systems typically communicate at radio frequencies of approximately 2 GHz. In order for a transmitter using a bit-stream generator to output a radio signal at 2 GHz with satisfactory noise characteristics, the frequency of the bit-stream provided to the switching power amplifier should be at least 8 GHz. Conventional bit-stream generators are not able to operate and provide outputs at such a high frequency.

Figure 4:
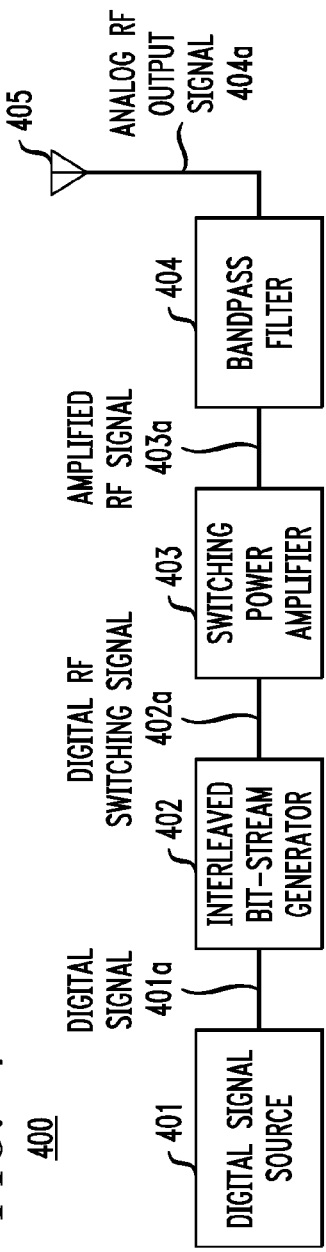
FIG. 4 shows a simplified block diagram of a power amplification segment of a transmitter in accordance with one embodiment of the disclosure.

FIG. 4 shows a simplified block diagram of power amplification system 400 of a transmitter in accordance with one embodiment of the disclosure. System 400 is similar to system 100 of FIG. 1, but with interleaved-bit-stream generator 402 replacing bit-stream generator 102 of FIG. 1. Note that digital signal source 401, switching power amplifier 403, bandpass filter 404, and antenna 405 may be substantially similar to the corresponding elements of power amplification system 100 of FIG. 1. Interleaved-bit-stream generator 402 generates digital RF switching signal 402a, which is used as the input to switching power amplifier 403. Interleaved-bit-stream generator 402 uses a plurality of fractional-delay filters operating at a relatively low frequency and connected to an interleaving serializer to generate a relatively high-frequency output. Switching power amplifier 403 outputs amplified RF signal 403a to bandpass filter 404, which, in turn, outputs analog RF output signal 404a to antenna 405.

Figure 5:
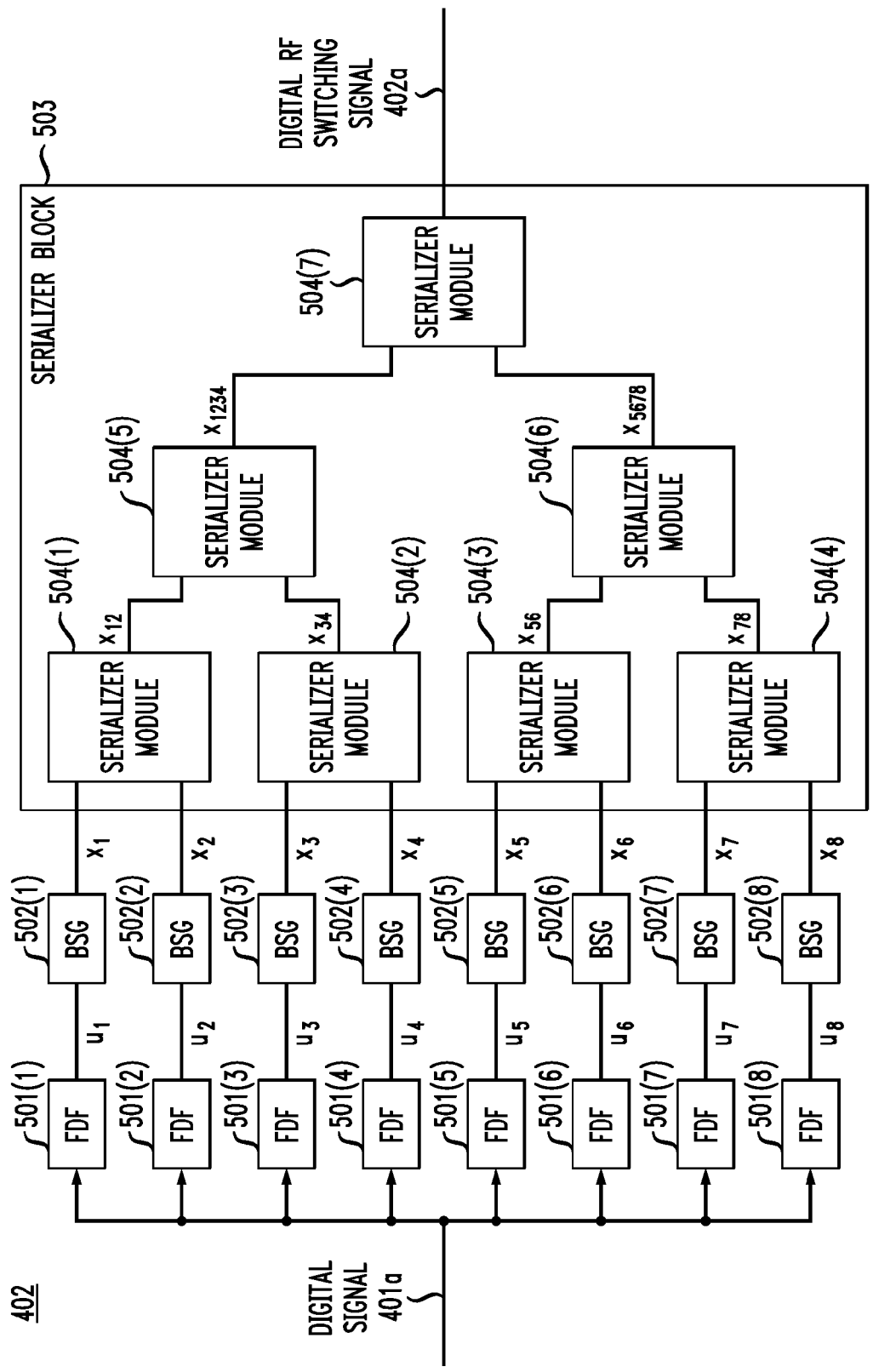
FIG. 5 shows a simplified block diagram of an exemplary implementation of the interleaved-bit-stream generator of FIG. 4.

FIG. 5 shows a simplified block diagram of an example implementation of interleaved-bit-stream generator 402 of FIG. 4. Interleaved-bit-stream generator 402 of FIG. 5 is an 8-path bit-stream generator. First, n-bit digital signal 401a, where n is an integer greater than 1, is applied to an array of eight parallel fractional delay (FD) filters 501(1)-501(8). In any particular processing cycle, each of FD filters 501(1)-501(8) receives the same sample. Note that digital signal 401a is also referred to herein as u.

FD filters 501(1)-501(8) are substantially identical to each other in structure, but each one introduces an independent fractional delay to the signal. Namely, FD filter 501(i) introduces into its corresponding signal a fractional delay represented by $\Phi_i$. The fractional delay of each FD filter 501(i) should be set so as to account for the total number of signals being interleaved, account for the desired signal manipulation, and compensate for any delays introduced by serializer block 503, which interleaves the signals. The delays for the FD filters 501 of one embodiment of interleaved-bit-stream generator 402 are discussed in detail below. Note that varying the fractional delay values of any of FD filters 501 will vary the signals output by FD filters 501 and, consequently, the resulting interleaved output of interleaved-bit-stream generator 402, which is digital RF switching signal 402a.

Each FD filter 501 may be implemented using a Farrow structure, which is a tunable fractional delay filter used to estimate the values of an input signal between existing discrete-time samples. In other words, FD filter 501 is an interpolation filter that can be used to compute new sample values at arbitrary points. A Farrow structure may be implemented as a polynomial-based digital filter. Note that each FD filter 501 may operate at the base-band rate of digital signal source 401 of FIG. 4, which may be, for example, 128 MHz, rather than at a radio-frequency rate such as, for example, 1 GHz. Operating each FD filter 501 at the lower rate would reduce power consumption of interleaved-bit-stream generator 402. Note that reducing power consumption would be particularly useful for power amplification systems that are powered by batteries and/or solar panels, since those power sources are generally not as robust as connections to the electric grid.

Figure 6:
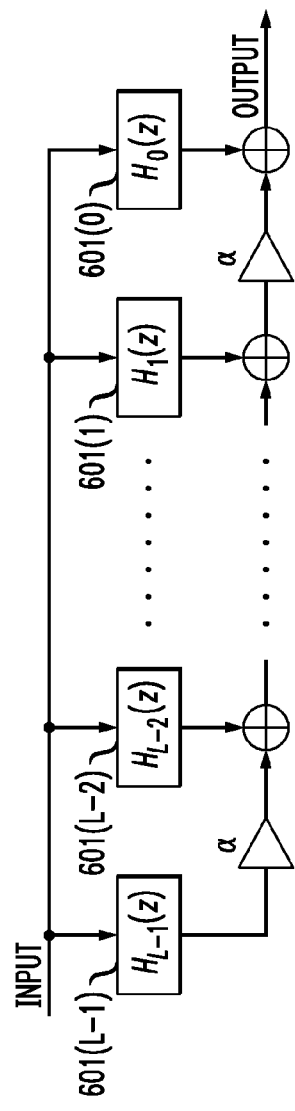
FIG. 6 shows a block diagram of an exemplary implementation of a Farrow structure.

FIG. 6 shows a block diagram of module 600, which is an example implementation of a Farrow structure. Module 600 comprises L FIR (finite impulse response) subfilters 601, where L is a positive integer and each subfilter 601(q) has a transfer function $H_q(z)$, where q is an integer between 0 and L−1, inclusive. All L FIR subfilters 601 have the same input. The output of subfilter 601(L−1), whose transfer function is $H_{L-1}(z)$, is scaled by a factor α—an adjustable gain parameter—and the result added to the output of subfilter 601(L−2), whose transfer function is $H_{L-2}(z)$. That sum is then scaled by the factor α and the result added to the output of subfilter 601(L−3) (not shown), whose transfer function is $H_{L-3}(z)$. This pattern repeats until the summation of the α-scaled penultimate sum with the output of subfilter 601(0), whose transfer function is $H_0(z)$. As would be appreciated by a person of skill in the art, there are known systems and methods for generating a Farrow structure having a particular desired fractional delay.

Figure 3:
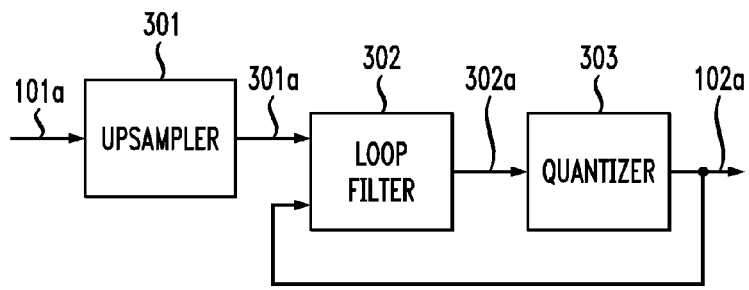
FIG. 3 shows a simplified block diagram of one implementation of the bit-stream generator of FIG. 1.

Referring again to FIG. 5, the output $u_i$ of each FD filter 501(i) is provided to a corresponding bit-stream generator 502(i). Bit-stream generators 502(1)-502(8) form an array of bit-stream generators corresponding to FD filter array 501(1)-501(8). Bit-stream generators 502(1)-502(8) are substantially identical to each other in structure and each may be implemented similarly to bit-stream generator 102 of FIG. 3. Note that other implementations of a bit-stream generator may be used instead. Each bit-stream generator 502(i) performs the up-sampling and quantizing functions described above and outputs a corresponding, relatively high-frequency, bit-stream $x_i$, which is provided to 8-to-1 serializer block 503. The bit-streams $x_1$-$x_8$ are at a first frequency such as, for example, 1 GHz.

Serializer block 503 comprises a funneling cascade of serializer modules 504(1)-(7), wherein each serializer module 504 is a 2-to-1 serializer that may be implemented as a switch. Each serializer module 504 takes two bit-stream inputs $x_A$ and $x_B$, where A and B represent signal identifiers, each of which has a first sampling frequency. Serializer module 504 then outputs a combined bit-stream signal $x_{AB}$, whose sampling frequency is double the first sampling frequency. The interleaving is performed on a bit-by-bit basis, wherein serializer 504 goes back and forth between outputting a bit from the first input bit-stream and a bit from the second input bit-stream.

The funneling cascade of serializer block 503 may be viewed as comprising three stages. In the first stage of the cascade, (a) bit-streams $x_1$ and $x_2$ are combined to generate bit-stream $x_{12}$, (b) bit-streams $x_3$ and $x_4$ are combined to generate bit-stream $x_{34}$, (c) bit-streams $x_5$ and $x_6$ are combined to generate bit-stream $x_{56}$, and (d) bit-streams $x_7$ and $x_8$ are combined to generate bit-stream $x_{78}$—by four respective serializer modules 504(1)-(4) operating at a second frequency such as, for example, 2 GHz, that is twice the first exemplary frequency of 1 GHz.

In the second stage of the cascade, (a) bit-streams $x_{12}$ and $x_{34}$ are combined to generate bit-stream $x_{1234}$, and (b) bit-streams $x_{56}$ and $x_{78}$ are combined to generate bit-stream $x_{5678}$—by two respective serializer modules 504(5) and 504(6) operating at a third frequency such as, for example, 4 GHz, that is twice the second exemplary frequency.

In the third stage of the cascade, bit-streams $x_{1234}$ and $x_{5678}$ are combined to generate bit-stream $x_{12345678}$—by one serializer module 504(7) operating at a fourth frequency such as, for example, 8 GHz, that is twice the third exemplary frequency. Bit-stream $x_{12345678}$ is used as output signal 402a of interleaved-bit-stream generator 402. The serializer modules 504 of the various cascade levels (1) may be structurally identical to the serial modules 504 of the other cascade levels, but operating at different frequencies or (2) may be structurally different from serializer modules 504 of other cascade levels to allow for optimization of performance at particular operational frequencies.

Note that alternative implementations of an 8-to-1 serializer may be used for serializer block 503. Serializer block 503 outputs digital RF switching signal 402a, which, as noted above, has a frequency eight times the frequency of the bit-streams output by bit-stream generators 502.

FIG. 7 shows exemplary MATLAB source code 700 for simulating the generation of band-pass bit-stream signals as shown in and described below in reference to, for example, FIGS. 8(A)-8(G). MATLAB is a registered trademark of MathWorks, Inc., of Natick, Mass. The source code shows particular coefficient values that may be used for corresponding modules of, for example, interleaved-bit-stream generator 402 of FIG. 5. The bit-stream generators are bypassed in this source code (in other words, $x_i=u_i$ for i=1 to 8), but the fractional delays are implemented. In other words, the $u_i$ signals are obtained using the array of fractional delay filters shown in FIG. 5. Also implemented are the series of interleaving operations, resulting in the final output of signal $x_{12345678}$. The time-domain signals are converted into frequency domain information using the fast Fourier transform (FFT) and plotted to create FIGS. 13-16, described further below. These simulations illustrate how the signals are up-converted via the interleaving process implemented by a series of serializer modules.

Source code 700 simulates a two-tone signal—in other words, a signal having two distinct frequency components. If multiplier a2 is set to 0, then source code 700 would be a single-tone signal as represented in FIGS. 8(A)-8(G). Source code 700 presents the fractional delays of FD filters 501 as sums of constants. For example, $\Phi_1$, the delay of signal $x_1$, applied by FD filter 501(1), is ph1_1+ph12_1+ph1234_1, which equals 0+0+0, or 0. The delays applied by the other FD filter 501 are shown below, where f is the digital frequency and N is the number of samples in a sampling period of signal 401a:

501(2): $\Phi_2=4/4*\pi*f/N$,
501(3): $\Phi_3=2/4*\pi*f/N+\pi$,
501(4): $\Phi_4=6/4*\pi*f/N+\pi$,
501(5): $\Phi_5=1/4*\pi*f/N-\pi/2$,
501(6): $\Phi_6=5/4*\pi*f/N-\pi/2$,
501(7): $\Phi_7=3/4*\pi*f/N+\pi/2$, and
501(8): $\Phi_8=7/4*\pi*f/N+\pi/2$.

Note that source code 700 uses the terms N1, N2 (which equals 2*N1), and N4 (which equals 4*N1). For greater simplification, N has been used above instead of N1 and substituted into the formulas using N2 and N4. Note that alternative implementations may use different delays. In particular, alternative implantations may add or subtract different fractions of it in order to generate high-pass, low-pass, or band-pass interleaved signals within serializer block 503.

For example, as noted in source code 700, one of the phase shift elements for signals $x_5$-$x_8$, indicated by the constant ph5678_1, may be either $\pi*f/(4*N)+\pi/2$—for high-side sampling—or $\pi*f/(4*N)-\pi/2$—for low-side sampling. The above-listed delays are intended for low-side sampling. In accordance with source code 700 and the above-described simplification, the applied delays for FD filters 501 for high-side sampling would be:

501(1): $\Phi_1=0$
501(2): $\Phi_2=4/4*\pi*f/N$,
501(3): $\Phi_3=2/4*\pi*f/N+\pi$,
501(4): $\Phi_4=6/4*\pi*f/N+\pi$,
501(5): $\Phi_5=1/4*\pi*f/N+\pi/2$,
501(6): $\Phi_6=5/4*\pi*f/N+\pi/2$,
501(7): $\Phi_7=3/4*\pi*f/N+3\pi/2$, and
501(8): $\Phi_8=7/4*\pi*f/N+3\pi/2$ As noted above, for greater simplification, N has been used above instead of N1 and substituted into the formulas using N2 and N4.

Below is an analysis of simulated exemplary operation of interleaved-bit-stream generator 402. Note that since the bit-stream generators 502(1)-502(8) act as high-fidelity radio-frequency digital modulators at the frequency band of interest, converting a higher-resolution multi-bit (e.g., 8-bit) signal into a lower-resolution fewer-bit (e.g., 1-bit) signal, the information in the frequency band of interest represented in each input signal $u_i$ is very close in detail to the information in the frequency band of interest represented in its corresponding output signal $x_i$, even though their respective sampling frequencies may be far apart. Consequently, the symbols $u_i$ and $x_i$ may be used interchangeably in the below analysis of interleaving of signals in the frequency band of interest.

FIG. 8(A) shows the frequency spectrum for exemplary bit-stream signal $x_1$, having a nominal frequency f and sampled at frequency Fs1, showing frequency components at close to zero frequency, or DC (i.e., direct current, which has a frequency of zero), and close to the exemplary signal's sampling frequency of Fs1. Note that single-tone signal $x_1$ shows two frequency components because of the aliasing caused by sampling, as would be appreciated by a person of ordinary skill in the art. Also note that frequency components are sometimes referred to as spectral components.

FIGS. 8(A)-8(G) are a series of simplified simulated frequency graphs illustrating the exemplary generation by serializer block 503 of FIG. 5 of a band-pass bit-stream output signal $X_{12345678}$ that represents a single tone near a desired output frequency of Fs8/4. Note that the sampling frequencies of the signals illustrated in FIGS. 8(A)-8(G) are Fs1, Fs2, Fs4, and Fs8, where Fs2 is twice Fs1, Fs4 is four times Fs1, and Fs8 is eight times Fs1. Output bit-stream signal $x_{12345678}$ is generated by interleaving eight input single-tone bit-stream signals, namely, $x_1$, $x_2$, $x_3$, $x_4$, $x_5$, $x_6$, $x_7$, and $x_8$, each sampled at sampling frequency Fs1 of, for example, 1 GHz.

Note that in actual operation, the truncation of least-significant bits in various arithmetic operations performed will result in some truncation error, which is similar to quantization error. As would be appreciated by a person of ordinary skill in the art, the location along the frequency spectrum of the truncation error may be shaped using mathematical operations so as to have the truncation error located at frequencies away from the frequency band of interest so that the truncation errors may be filtered out by an appropriate pass filter (e.g., a low-pass, high-pass, or band-pass filter). Note that any shaped truncation error components of the bit-stream signals in FIGS. 8(A)-8(G) are not shown.

Bit-stream signal $x_1$ of FIG. 8(A) is an exemplary output of bit-stream generator 502(1) of FIG. 5, whose input is signal $u_1$. As noted above, the frequency spectrum for signal $x_1$ includes spectral components at close to 0 Hz (or DC) and aliased components close to the signal's sampling frequency of Fs1. Bit-stream signal $x_2$ of FIG. 8(B) is an exemplary output of bit-stream generator 502(2), whose input is signal $u_2$. Exemplary signal $x_2$ also shows spectral components at close to DC and alias components close to the signal's sampling frequency of Fs1. Note that the input signals $u_1$ and $u_2$ of FIG. 5 were generated from the input signal 401a by passing input signal 401a through fractional delay filters 501(1) and 501(2), respectively, with corresponding fractional delays $\Phi_1$ and $\Phi_2$, respectively.

FIG. 8(C) shows the frequency spectrum of bit-stream signal $x_{12}$, sampled at sampling frequency Fs2 (e.g., 2 GHz) and which was obtained by interleaving $x_1$ and $x_2$, each sampled at sampling frequency Fs1 (e.g., 1 GHz). As can be seen, the interleaved signal $x_{12}$ has four frequency-spectrum components, one of which, at the lowest frequency, is considered the actual signal and the other three are considered aliases in the 0-Fs2 frequency range. The spectral component close to 0 Hz (or DC) is referred to as the low-pass component. The alias of the low-pass component resulting from sampling appears close to Fs2. The spectral component just below Fs2/2 is called a high-pass component, and its alias due to sampling is just above Fs2/2. In the particular case of FIG. 8(A) and FIG. 8(B), $x_1$ and $x_2$ are low-pass bit-streams. Also, the respective fractional delays, $\Phi_1$ and $\Phi_2$, for $x_1$ and $x_2$ are selected so that $x_{12}$ becomes a low-pass bit-stream where the high-pass component and its image in $x_{12}$ cancel out because they are generated to have opposite phases. This is done by setting the appropriate parameters for the corresponding fractional delay filters, as described elsewhere herein. Note that the canceled-out segments are shown as grayed out in FIG. 8(C) and subsequent figures. Note that $\Phi_1$ and $\Phi_2$ can, instead, be selected so that signal $x_{12}$ would, instead, become a high-pass bit stream where the low-pass component and its image in signal $x_{12}$ would cancel out.

FIG. 8(C) illustrates the use of the method described elsewhere herein for constructing signal $x_{12}$ as a low-pass bit-stream from the two low-pass bit-streams $x_1$ and $x_2$.

FIG. 8(D) shows, similarly to FIG. 8(C), the result of the use of the method described elsewhere herein to construct signal $x_{34}$ as a low-pass bit-stream from bit-streams $x_3$ and $x_4$.

FIG. 8(E) shows the subsequent generation of signal $x_{1234}$, which is constructed to be a high-pass bit-stream generated from the two low-pass bit-streams $x_{12}$ and $x_{34}$. The grayed out spectral components represent the canceled aliasing components. Note that the sampling frequency used for signal $x_{1234}$ is Fs4 (e.g., 4 GHz).

FIG. 8(F) shows, similarly to FIG. 8(E), the result of the use of the elsewhere-described method to construct signal $x_{5678}$ as a high-pass bit-stream generated from bit-streams $x_{56}$ and $x_{78}$. Signal $x_{56}$ (not shown) was generated from single-tone signals $x_5$ and $x_6$ (not shown) in a manner similar to the generation of signal $x_{12}$, as described above. Similarly, signal $x_{78}$ (not shown) was generated from single-tone signals $x_7$ and $x_8$ (not shown) in a manner similar to the generation of signal $x_{12}$, as described above.

FIG. 8(G) shows the result of the use of the elsewhere-described method to construct signal $x_{12345678}$ as a lower side band (LSB) band-pass sine wave, having a spectral component by Fs8/4 (e.g., 2 GHz), as desired. Note that the sampling frequency used for signal $x_{12345678}$ is Fs8 (e.g., 8 GHz).

The following is an explanation of the setting of the fractional delays implemented by FD filters 501 in FIG. 5 and enumerated above. These fractional delays are applied to input signal 401a in order to obtain the spectral plots shown in FIG. 8.

An analog sine-wave x can be described as $$x = A * \sin(2\pi * f * t + \Phi)$$

where A is constant coefficient, f is the frequency, t is the time, and $\Phi$ is a phase shift or delay. A digital sine-wave x can be described as $$x = A * \sin(2 * \pi * f/Fs * [1:N] + \Phi)$$

where N is the number of samples and Fs is the sampling frequency (using standard Matlab syntax). Therefore, f/Fs is the normalized digital frequency and [1:N], which represents the set [1, 2, 3, ..., N], represents the normalized digital time samples occurring during each sampling period Ts, which equals 1/Fs.

If $x_1$ and $x_2$ are low-pass sine waves of frequency f sampled at Fs1, then $x_{12}$, which is obtained by interleaving $x_1$ and $x_2$, will be: (1) a low-pass sine wave (with high-pass components cancelled) if $\Phi_1 = 0$ and $\Phi_2 = f*\pi/Fs1$ or (2) a high-pass sine wave (with low-pass components cancelled) if $\Phi_1 = 0$ and $\Phi_2 = f*\pi/Fs1 + \pi$. (Note that it is the relative phase difference between $\Phi_1$ and $\Phi_2$ that matters, not the absolute phase values of $\Phi_1$ and $\Phi_2$.

Similarly, if $x_3$ and $x_4$ are low-pass sine waves of frequency f sampled at Fs1, then $x_{34}$, which is obtained by interleaving $x_3$ and $x_4$, will be: (1) a low-pass sine wave (with high-pass components cancelled) if $\Phi_3 = 0$ and $\Phi_4 = f*\pi/Fs1$ or (2) a high-pass sine wave (with low-pass components cancelled) if $\Phi_1 = 0$ and $\Phi_2 = f*\pi/Fs1 + \pi$.

If $x_1$ and $x_2$ are high-pass sine waves of frequency f sampled at Fs1, then $x_{12}$, which is obtained by interleaving $x_1$ and $x_2$, will be: (1) a lower side band (LSB) band-pass sine wave (with upper side band (USB) components cancelled) if $\Phi_1 = 0$ and $\Phi_2 = f*\pi/Fs1 + \pi/2$ or (2) or an upper side band (USB) band-pass sine wave (with LSB components cancelled) if $\Phi_1 = 0$ and $\Phi_2 = f*\pi/Fs1 - \pi/2$. As noted above, the fractional delays implemented by particular fractional delay filters may be modified in accordance with the above descriptions to obtain different desired outputs as signal $x_{12345678}$.

FIG. 9 shows interleaved-bit-stream generator 900, which outputs digital RF switching signal 900a and is an alternative implementation of interleaved-bit-stream generator 402 of FIG. 4. Bit-stream generator 900 splits input signal 401a into sixteen signals provided to sixteen corresponding FD filters 901(1)-(16). Fractional delay filters 901 are substantially similar to FD filters 501 of FIG. 5. The outputs of corresponding pairs of FD filters 901(2i-1) and 901(2i), where i=1 to 8—such as 901(1) and 901(2)—are provided to corresponding adders 902(i). The output of each adder 902(i) is provided to corresponding bit-stream generator 502(i), which, together with serializer block 503, operates substantially the same as the corresponding elements of interleaved-bit-stream generator 402 of FIG. 5. Using the additional FD filters and adders allows for increased signal bandwidth, as explained below.

Figure 10A:
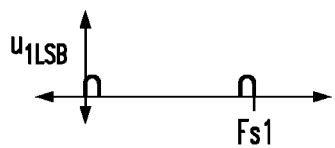
FIGS. 10(A)-10(B) help illustrate how the FD filter pairs and corresponding adders of FIG. 9 generate their corresponding outputs.
Figure 10B:
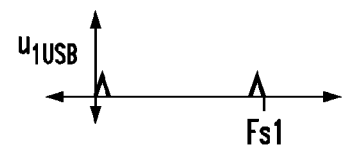

FIGS. 10(A)-10(B) help illustrate how the FD filter 901 pairs and corresponding adders 902 of FIG. 9—such as FD filters 901(1) and 901(2) and adder 902(1)—generate their corresponding outputs such—as signal $x_1$. Note that signals $x_2$-$x_8$ are similarly generated. In interleaved-bit-stream generator 900, signal 401a, or $u_i$ is input to, among others, fractional delay filters 901(1) and 901(2). The fractional delay implemented by fractional delay filter 901(1) (e.g., $\Phi_{1a}$) is different from the fractional delay implemented by fractional delay filter 901(2) (e.g., $\Phi_{1b}$). The outputs of FD filters 901(1) and 901(2)—$u_{1LSB}$ and $u_{1USB}$, respectively—are added by adder 902(1) to generate signal $u_1$ which is then provided to bit-stream generator 502(1) to generate signal $x_1$.

FIG. 10(A) is a frequency graph that shows—as upside-down U's—the spectral components—primary and aliased—of exemplary signal $u_{1LSB}$, which was generated to be a lower-side-band component signal. FIG. 10(B) shows—as upside-down V's—the spectral components of exemplary signal $U_{1USB}$, which was generated to be an upper-side-band component signal. After the interleaving of signal $x_1$ and similarly generated signals $x_2$-$x_8$ by serializer block 503, the resulting interleaved bandpass signal $x_{12345678}$ contains useful signal information on both sides of the target frequency, thereby effectively providing double the bandwidth of signals $x_1$-$x_8$ of FIGS. 8(A)-8(G). This is further described below.

FIGS. 11(A)-11(G) are a series of related frequency graphs illustrating the processing of signals in interleaved-bit-stream generator 900 of FIG. 9. The signals in FIGS. 11(A)-11(G) are similar to the signals in FIGS. 8(A)-8(G), but are narrow-band (and band-limited) signals, where the resultant signal $x_{12345678}$ is a band-pass signal constructed by interleaving signals $x_1$, $x_2$, $x_3$, $x_4$, $x_5$, $x_6$, $x_7$, and $x_8$. Note, however, that as described above in reference to signal $x_1$, each signal $x_i$ is generated using two fractional delay filters 901. Accordingly, the spectral components of each of signal $x_1$ in FIG. 11(A) and signal $x_2$ in FIG. 11(B) are represented by both an upside-down U—corresponding to the lower-side-band (LSB) component—and an upside-down V—corresponding to the upper-side-band component (USB). Note that the LSB and USB signal components in $x_1$ (and $x_2$) overlap in frequency but are discriminated by phases. FIGS. 11(A)-11(G) illustrate use of the above-described methods of selecting fractional delays and interleaving the signals $x_i$ to cancel aliases. FIG. 11(G) shows that the resultant signal $x_{12345678}$ has double the signal bandwidth of the individual input signals by placing the LSB and USB components side by side.

Figure 12A:
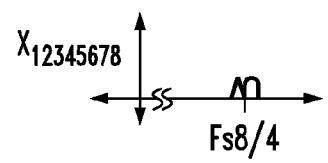
FIGS. 12(A)-12(D) show four variations for the spectral components for the signal of FIG. 11(G).
Figure 12B:
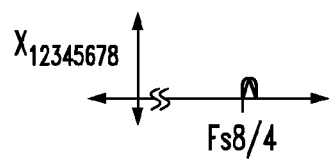
Figure 12C:
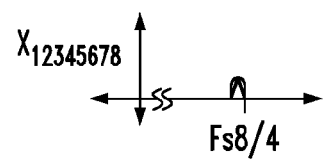
Figure 12D:
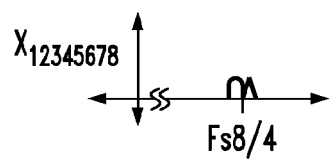

FIGS. 12(A)-12(D) show four variations for the spectral components around Fs8/4 for signal $x_{12345678}$ of FIG. 11(G) resulting from alternative implementations. The particular resultant variation depends on $x_{1LSB}$ and $x_{1USB}$, which depend on the particular delay settings of the corresponding fractional delay filters that output the signal. FIG. 12(D) shows the variation shown in FIG. 11(G) and described above. FIG. 12(A) shows another variation that provides double bandwidth by the frequency (Fs8)/4. FIG. 12(B) and FIG. 12(C) show variations where only the regular bandwidth is available and USB and LSB overlap in frequency, which may not be desirable.

FIGS. 13(A)-13(C) show time (on the left) and corresponding spectral plots (on the right) of simulations using input single tones $x_A$ and $x_B$ in generating low-pass (FIG. 13(A)), high-pass (FIG. 13(B)), and band-pass (FIG. 13(C)) signals $x_{AB}$, respectively, where A and B are signal identifiers. Note that (1) low-pass signals refers to signals whose frequencies are predominantly close to zero, (2) high-pass signals refers to signals whose frequencies are predominantly close to Fs/2, where Fs is the sampling frequency, and (3) band-pass signals refers to signals whose frequencies fall between low-pass and high-pass (e.g., close to Fs/4).

Input tone $x_A$ is illustrated in the top two graphs and input tone $x_B$ is illustrated in the middle two graphs of FIGS. 13(A)-13(C). The resultant signal $x_{AB}$ is illustrated in the bottom two graphs of FIGS. 13(A)-13(C). Specifically, FIG. 13(A) illustrates the interleaving of input signals $x_1$ and $x_2$ to generate low-pass signal $x_{12}$. Low-pass signal $x_{34}$ would be similarly generated. FIG. 13(B) illustrates the interleaving of input signals $x_{12}$ and $x_{34}$ to generate high-pass output signal $x_{1234}$. High-pass signal $x_{5678}$ would be similarly generated. FIG. 13(C) illustrates the interleaving of input signals $x_{1234}$ and $x_{5678}$ to generate band-pass output signal $x_{12345678}$.

FIGS. 14(A)-14(B) show time and corresponding spectral plots for exemplary scenarios of using dual tones in generating low-pass and high-pass signals, respectively. The dual tones may be generated as described above in reference to FIG. 9 and FIGS. 10(A)-10(B). FIG. 14(A) and FIG. 14(B) show simulations illustrating scenarios similar to those shown in FIGS. 11(A)-11(F).

FIGS. 15(A)-15(D) show time and corresponding spectral plots for exemplary lower-sideband and upper-side-band scenarios using dual tones in generating band-pass signals. FIGS. 15(A)-15(D) show simulations illustrating scenarios similar to the variations shown in FIGS. 12(A)-12(D).

Figure 16B:
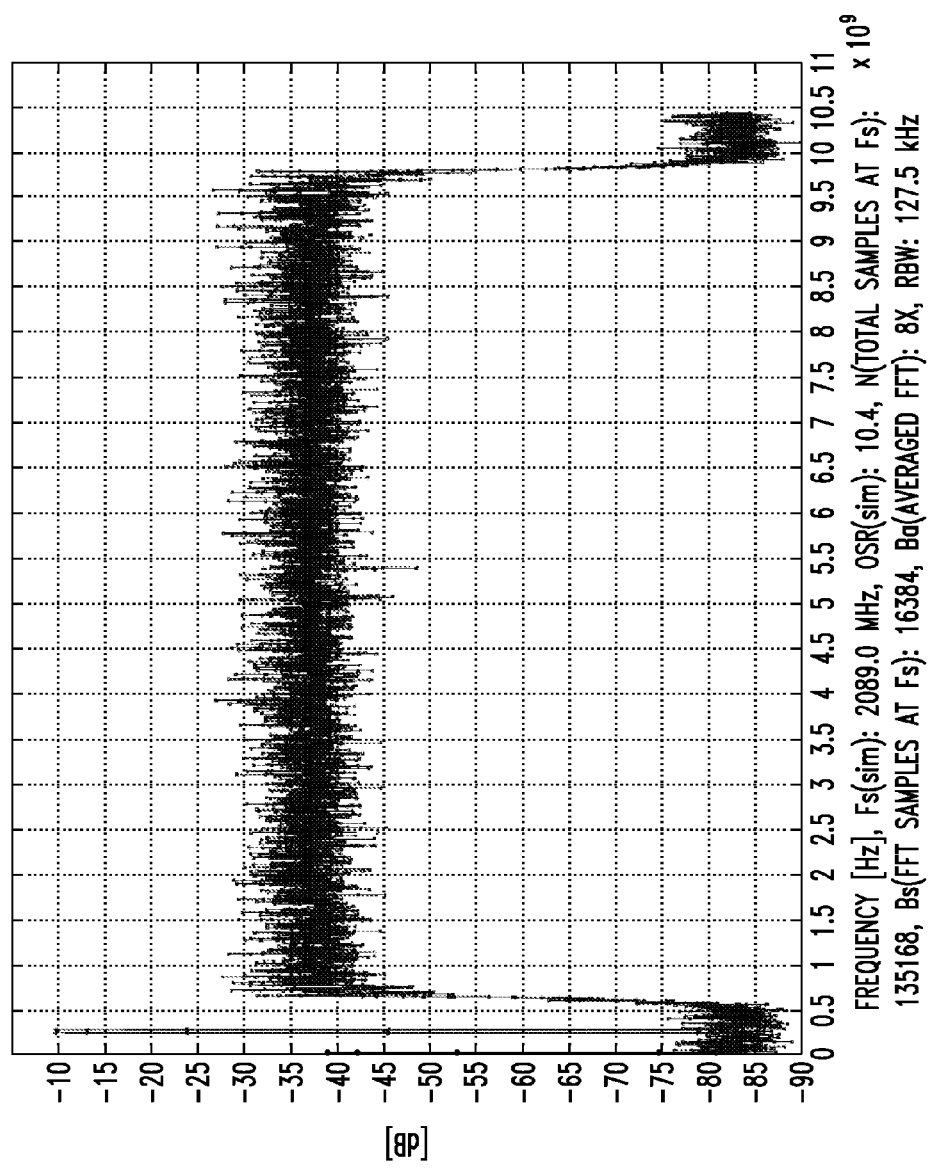
Figure 16C:
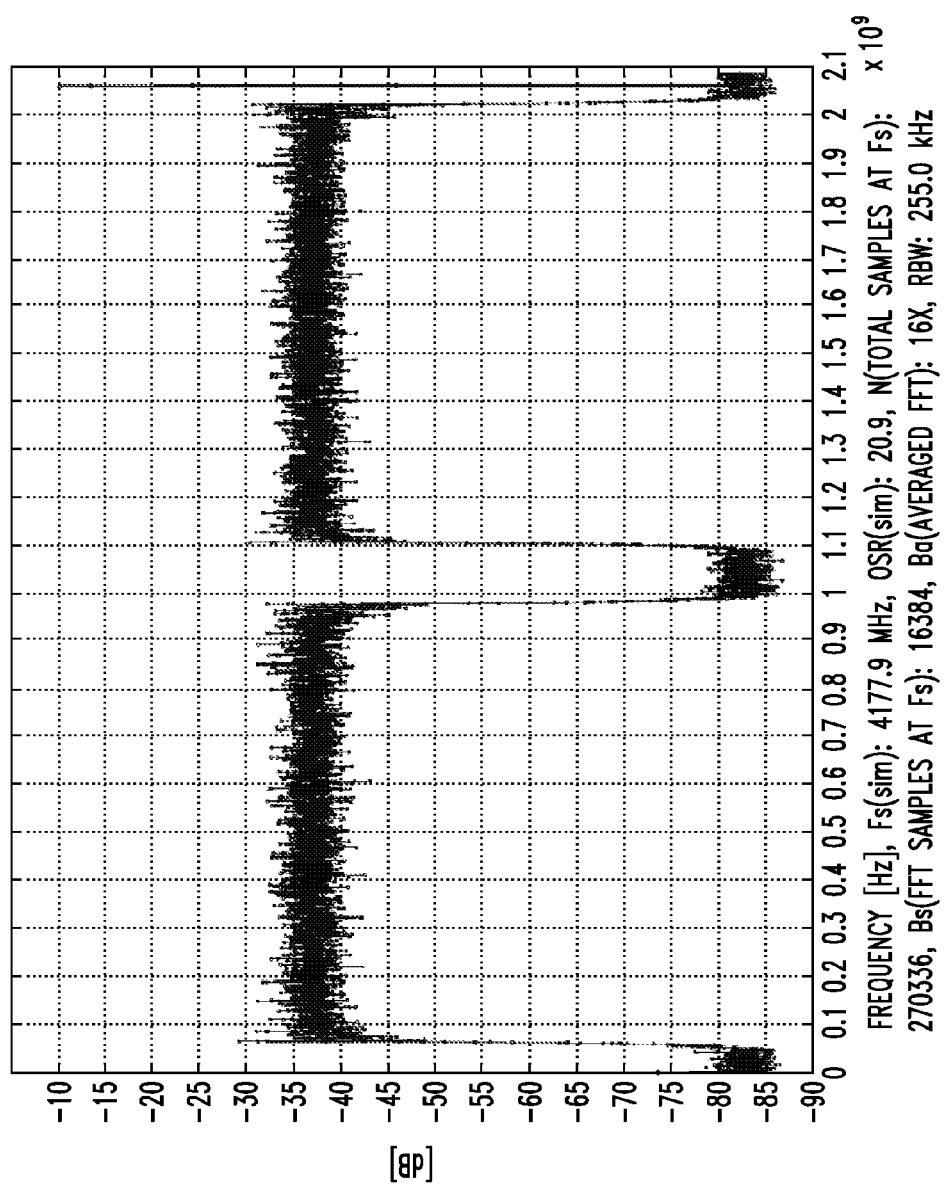
Figure 16D:
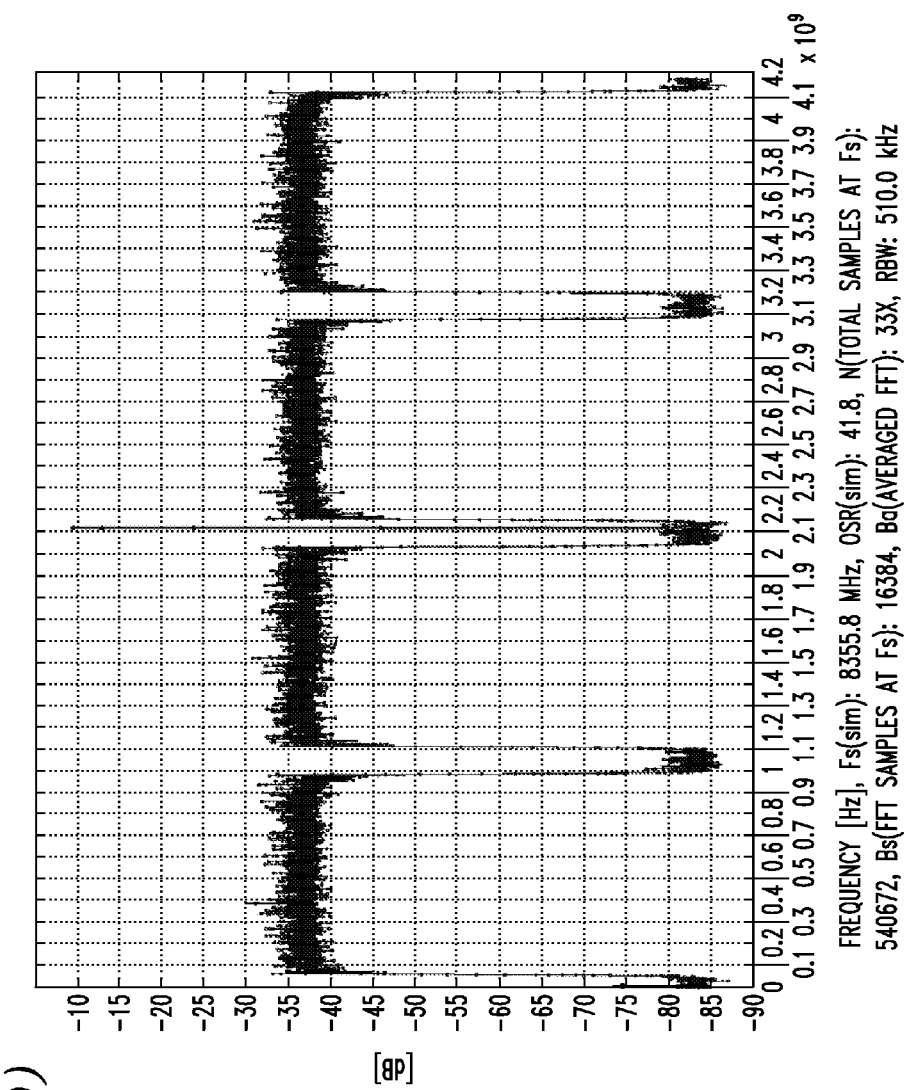

FIGS. 16(A)-16(D) show spectral plots for exemplary scenarios of FIGS. 8(A)-8(G), incorporating bit-stream generators, and using dual-tone bit-streams in generating various signals. FIG. 16(A) shows a sample spectral plot for low-pass dual-tone bit-stream $x_1$. FIG. 16(B) shows a sample spectral plot for low-pass dual-tone interleaved bit-stream $x_{12}$. FIG. 16(C) shows a sample spectral plot for high-pass dual-tone bit-stream $x_{1234}$. FIG. 16(D) shows a sample spectral plot for band-pass dual-tone bit-stream $x_{12345678}$.

Exemplary embodiments have been described where n=8, in other words, using arrays of eight FD filters and bit-stream generators. Alternative multi-path embodiments use different values of n, with corresponding numbers of FD filters, bit-stream generators, and serializer inputs. In some alternative embodiments, the fractional delays of the FD filters are spaced 1/n of a sample period apart. For example, in one four-path embodiment, the fractional delays are ¼, ½, ¾, and 1 of a sample period. In another four-path embodiment, the fractional delays are 0, ¼, ½, and ¾ of a sample period.

An exemplary embodiment has been described where all of the FD filters of interleaved-bit-stream generator 402 of FIG. 5, and of interleaved-bit-stream generator 900 of FIG. 9, respectively, are identical to each other in structure. In alternative embodiments, interleaved-bit-stream generator 402, or interleaved-bit-stream generator 900, includes two or more FD filters having different structures.

An exemplary embodiment has been described where all of the bit-stream generators of an interleaved-bit-stream generator, such as interleaved-bit-stream generator 402 of FIG. 5 or interleaved-bit-stream generator 900 of FIG. 9, are identical to each other in structure. In alternative embodiments, interleaved-bit-stream generator 402, or interleaved-bit-stream generator 900, includes two or more bit-stream generators having different structures.

An exemplary embodiment has been described where all of the serializer modules of serializer block 503 of FIG. 5 and FIG. 9 are identical to each other in structure. In alternative embodiments, serializer block 503 includes two or more serializer modules having different structures.

As used herein in reference to data transfers between entities in the same device, and unless otherwise specified, the terms "receive" and its variants can refer to receipt of the actual data, or the receipt of one or more pointers to the actual data, wherein the receiving entity can access the actual data using the one or more pointers.

Exemplary embodiments have been described wherein particular entities (a.k.a. modules) perform particular functions. However, the particular functions may be performed by any suitable entity and are not restricted to being performed by the particular entities named in the exemplary embodiments.

Exemplary embodiments have been described with data flows between entities in particular directions. Such data flows do not preclude data flows in the reverse direction on the same path or on alternative paths that have not been shown or described. Paths that have been drawn as bidirectional do not have to be used to pass data in both directions.

Signals and corresponding nodes or ports may be referred to by the same name and are interchangeable for purposes here.

References herein to the verb "to generate" and its variants in reference to information or data do not necessarily require the creation and/or storage of new instances of that information. The generation of information could be accomplished by identifying an accessible location of that information. The generation of information could also be accomplished by having an algorithm for obtaining that information from accessible other information.

The present invention may be implemented as circuit-based systems, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

The present invention can also be embodied in the form of a bitstream or other sequence of signal values stored in a non-transitory recording medium generated using a method and/or an apparatus of the present invention.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

We claim:

1. A system comprising:
an interleaved bit-stream generator adapted to receive a first digital input signal and output a switching signal, the interleaved-bit-stream generator comprising:
a fractional-delay array adapted to receive the first digital input signal and output a plurality of fractionally delayed digital output signals;
a bit-stream generation array adapted to receive the plurality of fractionally delayed digital output signals and output a plurality of corresponding bit-streams; and
a serializer block adapted to receive the plurality of corresponding bit-streams and interleave the bit-streams to generate the switching signal, wherein a frequency of the switching signal is higher than a frequency of the first digital input signal.

2. The system of claim 1, wherein:
the fractional-delay array comprises M fractional-delay filters, where M is an integer greater than 1;
the bit-stream generator array comprises P bit-stream generators;

each fractional-delay filter receives the first digital input signal, introduces a corresponding fractional delay $\Phi_j$, and outputs a corresponding fractionally delayed digital output signal $v_j$;

j corresponds to the integers from 1 to M;

each bit-stream generator receives a fractionally delayed output signal $u_i$, based on the output of at least one corresponding fractional-delay filter, and generates a corresponding bit-stream $x_i$; and l corresponds to the integers from 1 to P.

3. The system of claim 2, wherein:
M=P; and
$v_j=u_i$.

4. The system of claim 3, wherein:
M=P=8;
the first digital input signal has a digital frequency f;
the first digital input signal has a sampling period having N samples;
$\Phi_1=0$;
$\Phi_2=4/4*\pi*f/N$;
$\Phi_3=2/4*\pi*f/N+\pi$;
$\Phi_4=6/4*\pi*f/N+\pi$;
$\Phi_5=1/4*\pi*f/N-\pi/2$;
$\Phi_6=5/4*\pi*f/N-\pi/2$;
$\Phi_7=3/4*\pi*f/N+\pi/2$; and
$\Phi_8=7/4*\pi f*N+\pi/2$.

5. The system of claim 3, wherein:
M=P=8;
the first digital input signal has a digital frequency f;
the first digital input signal has a sampling period having N samples;
$\Phi_1=0$;
$\Phi_2=4/4*\pi*f/N$;
$\Phi_3=2/4*\pi*f/N+\pi$;
$\Phi_4=6/4*\pi*f/N+\pi$;
$\Phi_5=1/4*\pi*f/N+\pi/2$;
$\Phi_6=5/4*\pi*f/N+\pi/2$;
$\Phi_7=3/4*\pi*f/N+3\pi/2$; and
$\Phi_8=7/4*\pi f*N+3\pi/2$.

6. The system of claim 2, wherein:
M=2*P;
the fractional-delay array further comprises P adders; and
adder i adds the outputs $v_{2i-1}$ and $v_{2i}$ of fractional-delay filter 2i−1 and fractional-delay filter 2i, respectively, to generate fractionally delayed output signal $u_i$.

7. The system of claim 6, wherein:
P=8; and
M=16.

8. The system of claim 6, wherein:
$\Phi_{2i-1}$ is different from $\Phi_{2i}$.

9. The system of claim 6, wherein:
$\Phi_{2i-1}$ is selected so that $v_{2i-1}$ is a lower-side-band component signal; and
$\Phi_{2i}$ is selected so that $v_{2i}$ is an upper-side-band component signal.

10. The system of claim 1, wherein the system is powered by one or more batteries.

11. A method comprising:
receiving, by an interleaved bit-stream generator, a first digital input signal, wherein the interleaved bit-stream generator comprises:
 a fractional-delay array;
 a bit-stream generation array; and
 a serializer block;
receiving, by the fractional-delay array, the first digital input signal;

outputting, by the fractional-delay array, a plurality of fractionally delayed digital output signals;

receiving, by the bit-stream generation array, the plurality of fractionally delayed digital output signals;

outputting, by the bit-stream generation array, a plurality of corresponding bit-streams;

receiving, by the serializer block, the plurality of corresponding bit-streams;

interleaving, by the serializer block, the plurality of bit-streams to generate a corresponding switching signal, wherein a frequency of the switching signal is higher than a frequency of the first digital input signal; and outputting, by the interleaved bit-stream generator, the switching signal.

12. The method of claim 11, wherein:
the fractional-delay array comprises M fractional-delay filters, where M is an integer greater than 1;
the bit-stream generator array comprises P bit-stream generators;
j corresponds to the integers from 1 to M;
i corresponds to the integers from 1 to P; and
the method comprises:
 receiving, by each fractional-delay filter, the first digital input signal,
 introducing, by each fractional-delay filter, a corresponding fractional delay $\Phi_j$;
 outputting, by each fractional-delay filter, a corresponding fractionally delayed digital output signal $v_j$;
 receiving, by each bit-stream generator, a fractionally delayed output signal $u_i$, based on the output of at least one corresponding fractional-delay filter; and
 generating, by each bit-stream generator, a corresponding bit stream $x_i$.

13. The method of claim 12, wherein:
M=P; and
$v_j=u_i$.

14. The method of claim 13, wherein:
M=P=8;
the first digital input signal has a digital frequency f;
the first digital input signal has a sampling period having N samples;
$\Phi_1=0$;
$\Phi_2=4/4*\pi*f/N$;
$\Phi_3=2/4*\pi*f/N+\pi$;
$\Phi_4=6/4*\pi*f/N+\pi$;
$\Phi_5=1/4*\pi*f/N-\pi/2$;
$\Phi_6=5/4*\pi*f/N-\pi/2$;
$\Phi_7=3/4*\pi*f/N+\pi/2$; and
$\Phi_8=7/4*\pi*f/N+\pi/2$.

15. The method of claim 13, wherein:
M=P=8;
the first digital input signal has a digital frequency f;
the first digital input signal has a sampling period having N samples;
$\Phi_1=0$;
$\Phi_2=4/4*\pi*f/N$;
$\Phi_3=2/4*\pi*f/N+\pi$;
$\Phi_4=6/4*\pi*f/N+\pi$;
$\Phi_5=1/4*\pi*f/N+\pi/2$;
$\Phi_6=5/4*\pi*f/N+\pi/2$;
$\Phi_7=3/4*\pi*f/N+3\pi/2$; and
$\Phi_8=7/4*\pi*f/N+3\pi/2$.

16. The method of claim 12, wherein:
M=2*P;
the fractional-delay array further comprises P adders; and
the method further comprises adding, by adder i, the outputs $v_{2i-1}$ and $v_{2i}$ of fractional-delay filter 2i−1 and fractional-delay filter $2i$, respectively, to generate fractionally delayed output signal $u_i$.

17. The method of claim 16, wherein:
P=8; and
M=16.

18. The method of claim 16, wherein:
$\Phi_{2i-1}$ is different from $\Phi_{2i}$.

19. The method of claim 16, further comprising:
selecting $\Phi_{2i-1}$ so that $v_{2i-1}$ is a lower-side-band component signal; and
selecting $\Phi_{2i}$ so that $v_{2i}$ is an upper-side-band component signal.

20. A method comprising:
receiving a first digital input signal;
outputting a plurality of fractionally delayed digital output signals;
outputting a plurality of corresponding bit-streams;
interleaving the plurality of bit-streams to generate a corresponding switching signal, wherein a frequency of the switching signal is higher than a frequency of the first digital input signal; and
outputting the switching signal.

* * * * *